(12) United States Patent
Sakamoto et al.

(10) Patent No.: US 8,994,090 B2
(45) Date of Patent: Mar. 31, 2015

(54) NONVOLATILE SEMICONDUCTOR STORAGE DEVICE AND METHOD OF MANUFACTURING THE SAME

(71) Applicant: Kabushiki Kaisha Toshiba, Minato-ku (JP)

(72) Inventors: Wataru Sakamoto, Yokkaichi (JP); Kazuma Takahashi, Kuwana (JP); Hideto Takekida, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/024,801

(22) Filed: Sep. 12, 2013

(65) Prior Publication Data

US 2014/0264537 A1 Sep. 18, 2014

(30) Foreign Application Priority Data

Mar. 13, 2013 (JP) ................................. 2013-050398

(51) Int. Cl.
  *H01L 29/788* (2006.01)
  *H01L 21/336* (2006.01)
  *H01L 21/28* (2006.01)
  *H01L 27/115* (2006.01)

(52) U.S. Cl.
  CPC ........ *H01L 29/788* (2013.01); *H01L 21/28273* (2013.01); *H01L 27/11531* (2013.01); *H01L 29/7881* (2013.01)
  USPC .......................................... 257/315; 438/260

(58) Field of Classification Search
  USPC .................. 438/260–266, 594; 257/314–321, 257/E29.255–E29.3
  See application file for complete search history.

(56) References Cited

U.S. PATENT DOCUMENTS 5,866,930 A   2/1999  Saida et al.
7,445,994 B2 * 11/2008  Lee et al. ...................... 438/257

(Continued)

FOREIGN PATENT DOCUMENTS

JP         9-64209 A      3/1997
JP     2006-344746 A     12/2006

(Continued)

*Primary Examiner* — Calvin Lee
(74) *Attorney, Agent, or Firm* — Oblon, McClelland, Maier & Neustadt, L.L.P.

(57) ABSTRACT

A nonvolatile semiconductor storage device including a memory cell region including a memory cell having a charge storing layer above a gate insulating film and a control electrode above the charge storing layer via an interelectrode insulating film; and a peripheral circuit region including a peripheral element having a first polysilicon and a first insulating film above the first polysilicon; wherein the charge storing layer includes a polysilicon doped with P-type impurity including a first upper region contacting the interelectrode insulating film and having a first doped layer doped with carbon or nitrogen, and at least a portion of a region below the first doped layer is neither doped with carbon nor nitrogen, and wherein the first polysilicon includes a second upper region contacting the first insulating film and having a second doped layer doped with carbon or nitrogen, the first and the second doped layers having equal thickness.

6 Claims, 41 Drawing Sheets

(56) References Cited

U.S. PATENT DOCUMENTS

| | | |
|---|---|---|
| 7,906,806 B2 | 3/2011 | Rosmeulen |
| 8,466,506 B2 * | 6/2013 | Takekida ................ 257/315 |
| 2006/0281244 A1 | 12/2006 | Ichige et al. |
| 2008/0237686 A1 | 10/2008 | Yabuhara |
| 2011/0001180 A1 | 1/2011 | Masuda et al. |
| 2011/0198682 A1 | 8/2011 | Naruke |
| 2011/0204433 A1 * | 8/2011 | Fujita et al. ............. 257/326 |
| 2011/0254073 A1 | 10/2011 | Takekida et al. |
| 2012/0292676 A1 * | 11/2012 | Pan ........................ 257/290 |

FOREIGN PATENT DOCUMENTS

| | | |
|---|---|---|
| JP | 2008-244108 A | 10/2008 |
| JP | 2009-141354 A | 6/2009 |
| JP | 2010-34289 A | 2/2010 |
| JP | 2010-40754 A | 2/2010 |
| JP | 2011-14838 A | 1/2011 |
| JP | 2011-171475 A | 9/2011 |
| JP | 2011-228432 A | 11/2011 |

* cited by examiner

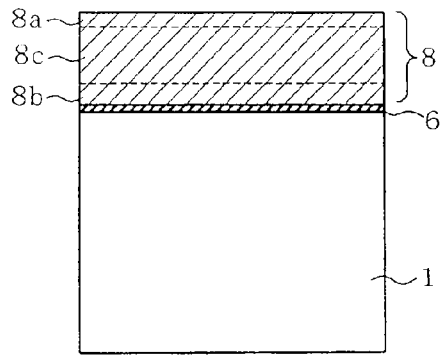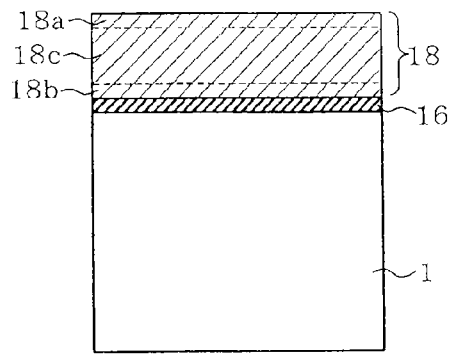
FIG. 6A   FIG. 6B
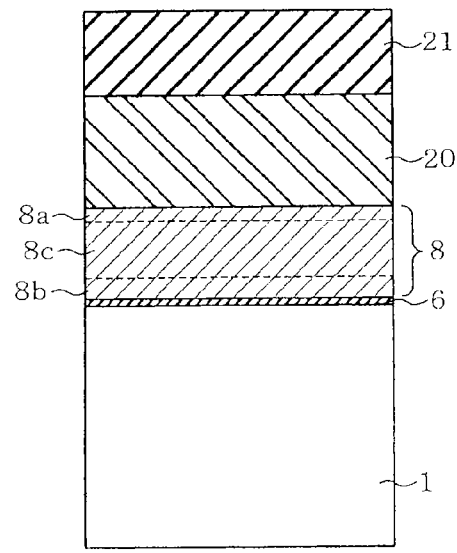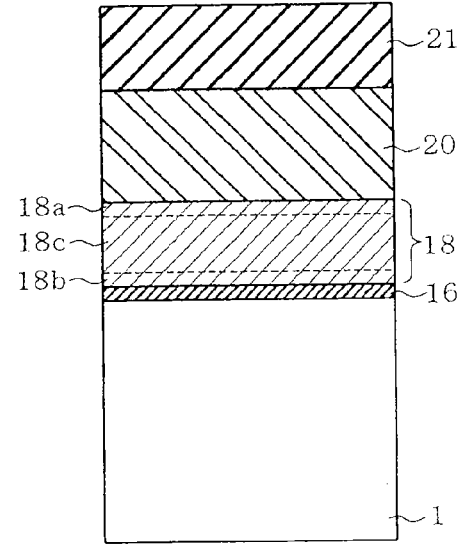
FIG. 7A   FIG. 7B

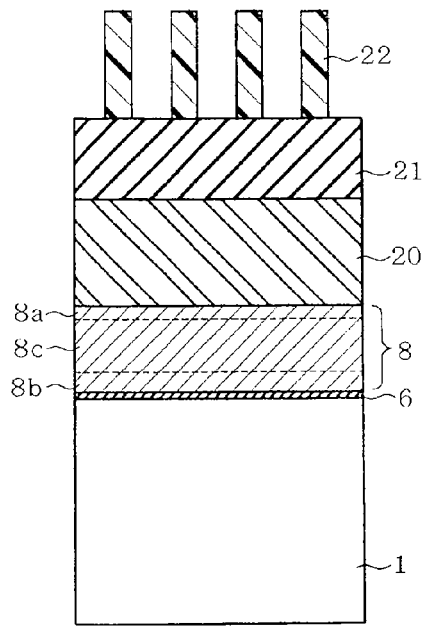 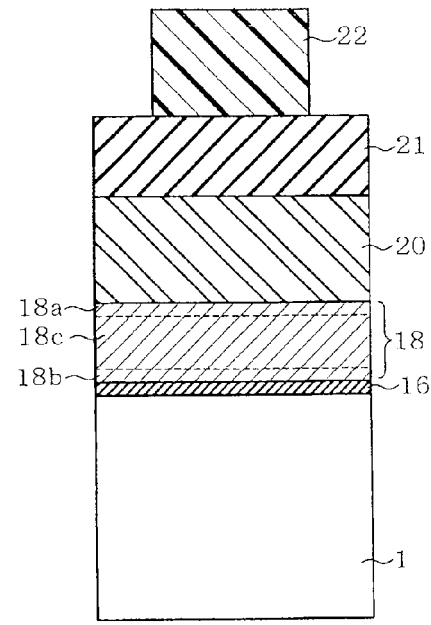
FIG.8A  FIG.8B
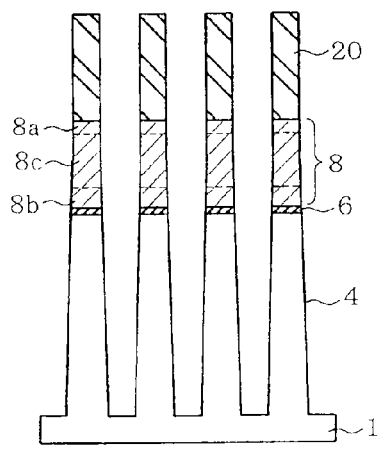 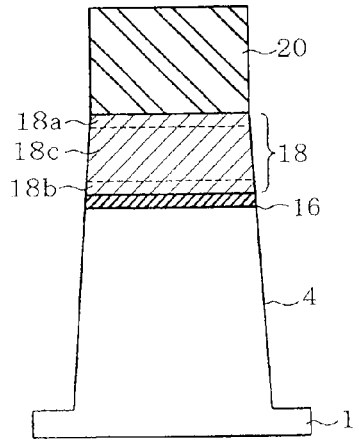
FIG.9A  FIG.9B

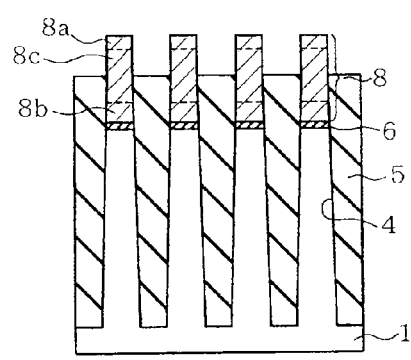 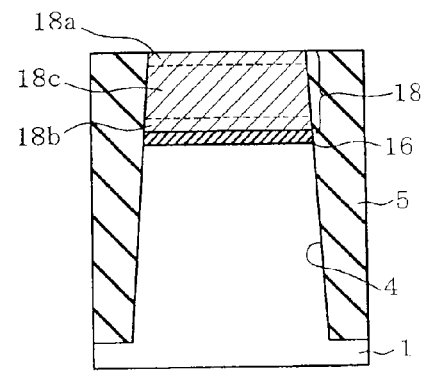
FIG.10A  FIG.10B
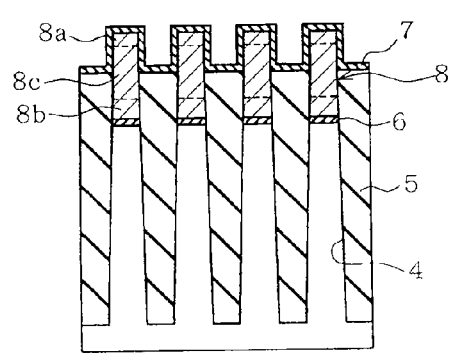 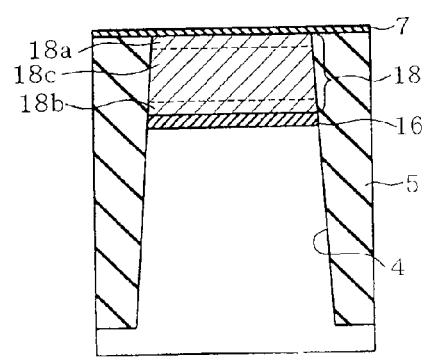
FIG.11A  FIG.11B

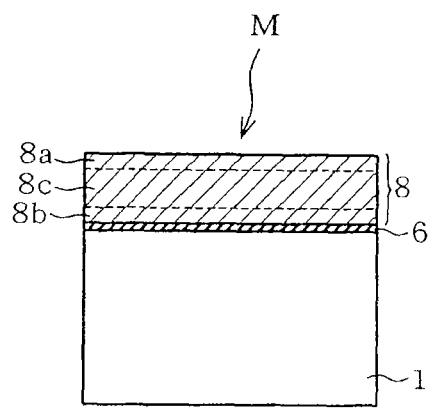 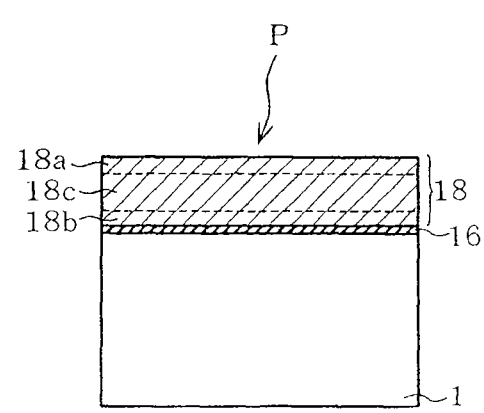
FIG.15A    FIG.15B
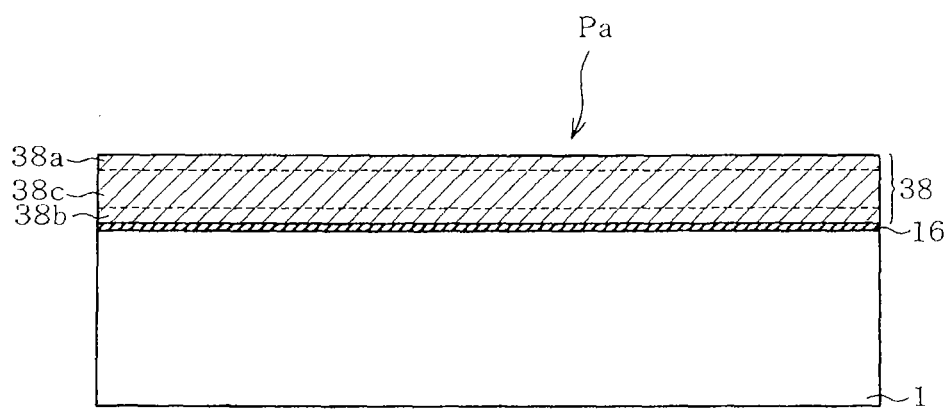
FIG.15C

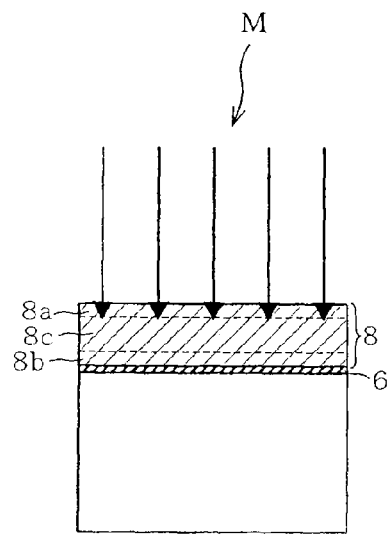
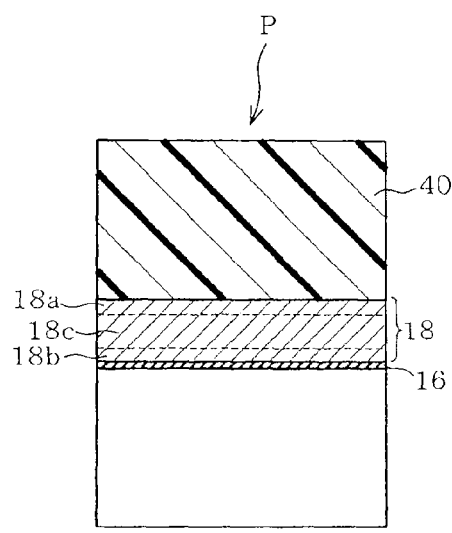
FIG.16A   FIG.16B
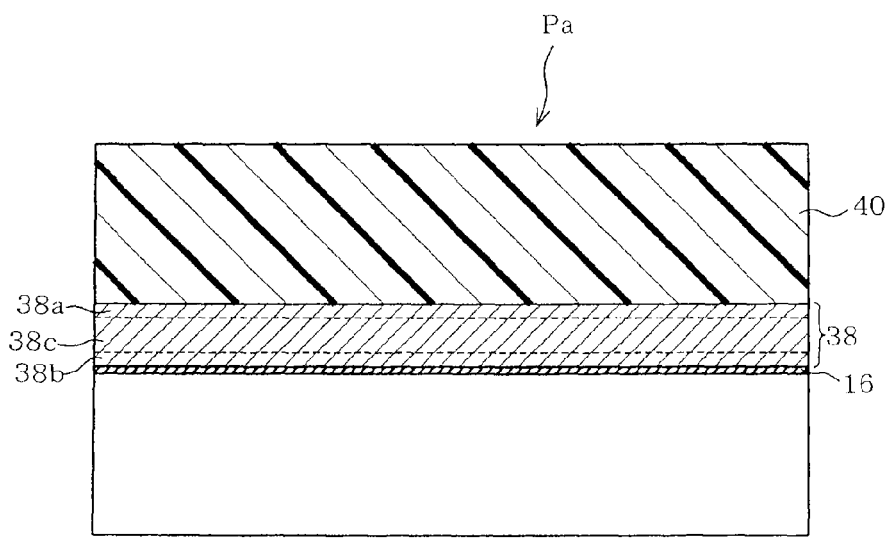
FIG.16C

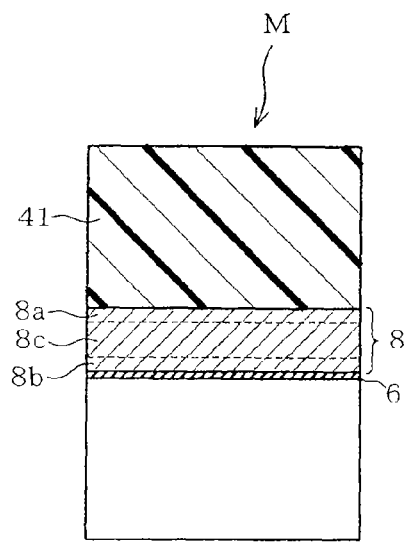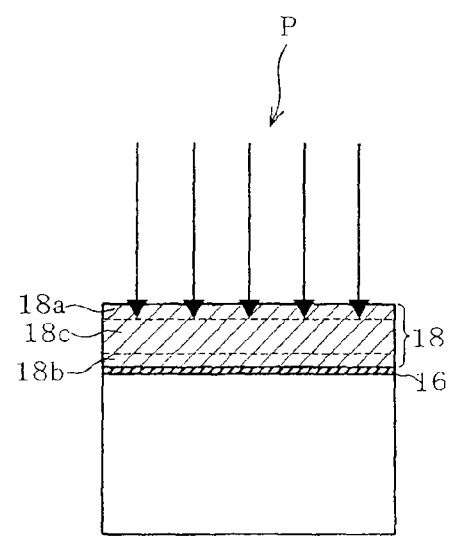
FIG.17A  FIG.17B
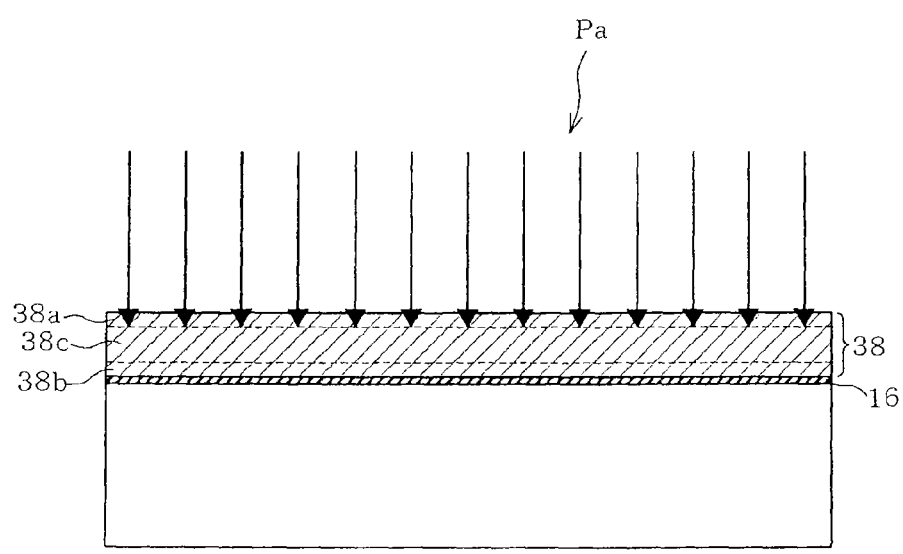
FIG.17C

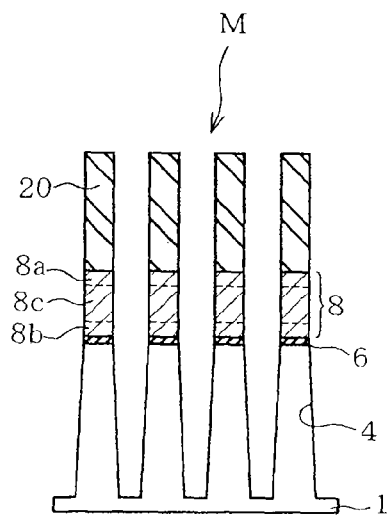
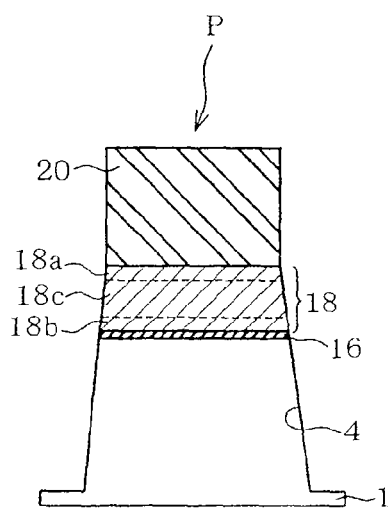
FIG.18A  FIG.18B
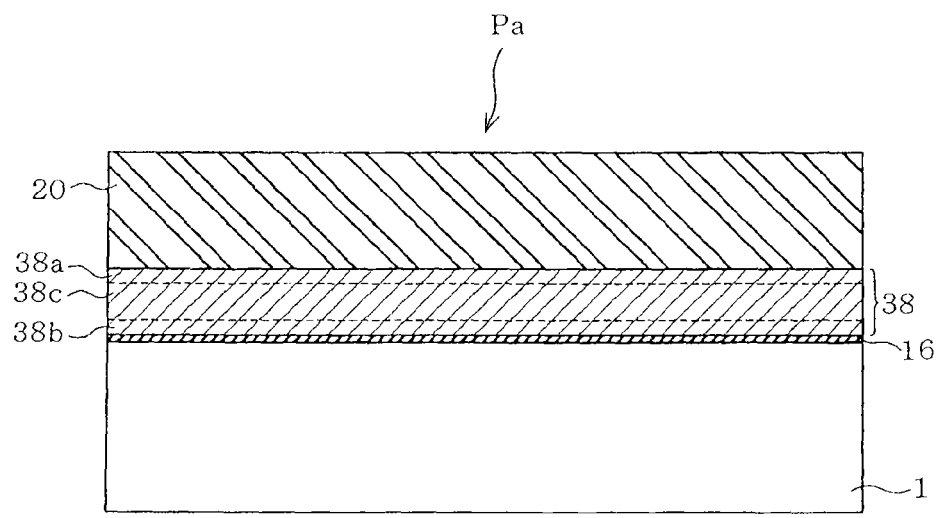
FIG.18C

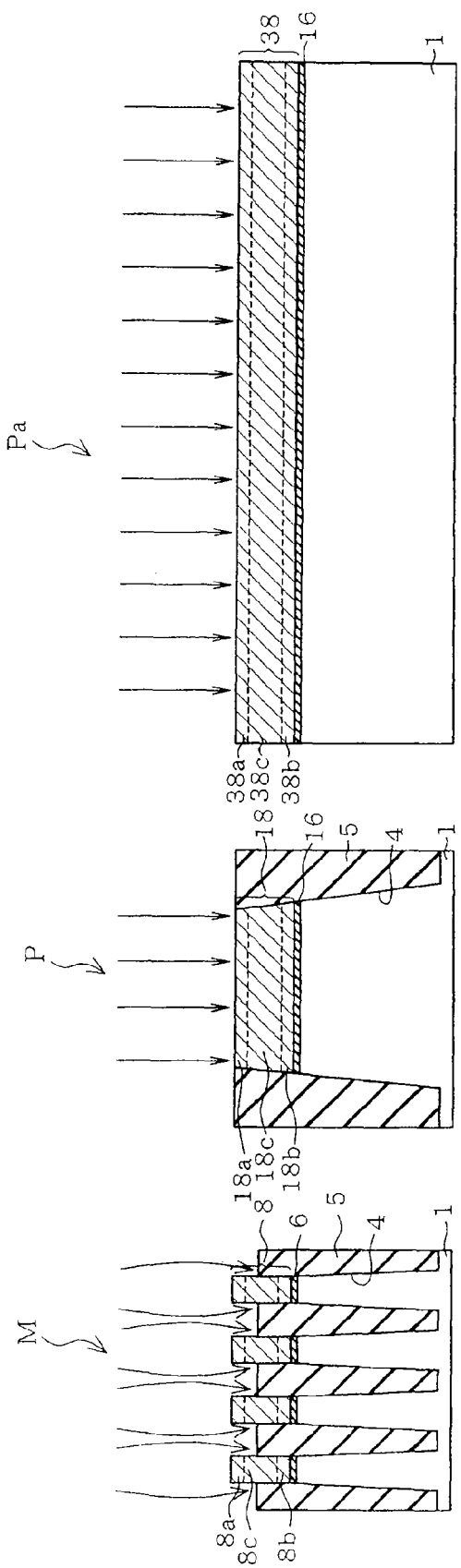

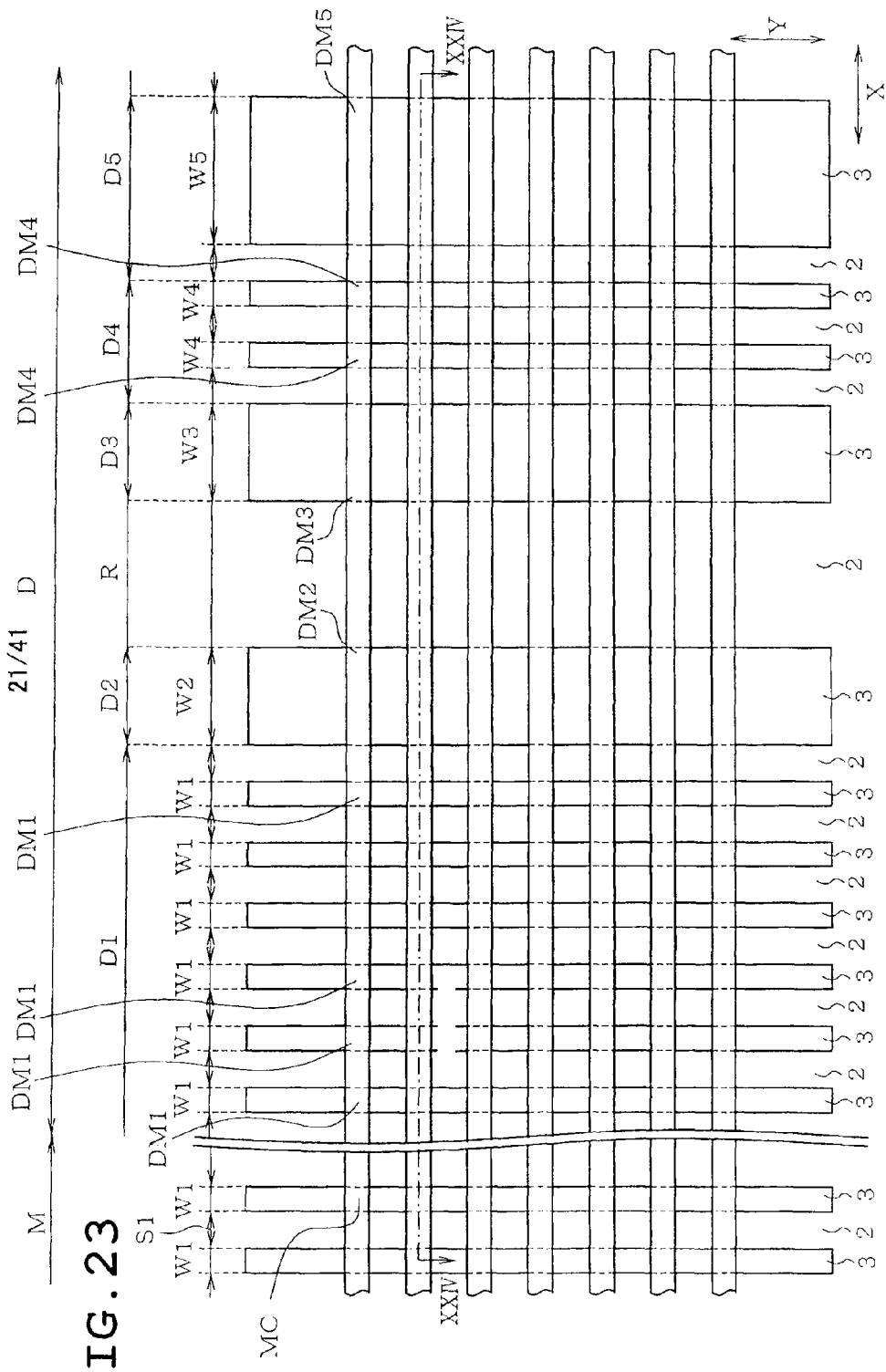

NONVOLATILE SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2013-050398, filed on, Mar. 13, 2013 the entire contents of which are incorporated herein by reference.

FIELD

Embodiments disclosed herein generally relate to a nonvolatile semiconductor storage device and a method of manufacturing the same.

BACKGROUND

Memory elements and a design rule of nonvolatile semiconductor storage devices such as NAND flash memory are shrunk in recent years. As the elements become smaller, reduction of the so-called coupling ratio occurs. The reduction of coupling ratio may degrade the data programming properties when programming the memory cells.

BRIEF DESCRIPTION OF THE DRAWINGS

FIGS. 6A to 12A and FIGS. 6B to 12B, are examples of vertical cross sectional views each schematically illustrating one phase of the manufacturing process flow of a portion corresponding to FIGS. 5A and 5B of the first embodiment;

FIGS. 15A to 15C, 16A to 16C, 17A to 17C, 18A to 18C, and 19A to 19C are examples of vertical cross sectional views each schematically illustrating one phase of the manufacturing process flow of a portion corresponding to FIGS. 14A to 14C of the second embodiment;

FIG. 19D is one schematic example of a vertical cross-sectional view taken along line XIX_D-XIX_D of FIG. 13 of the second embodiment.

FIG. 23 illustrates a third embodiment and is one example of a plan view schematically illustrating a dummy cell region and its peripheral structures.

DESCRIPTION

Figure 1:
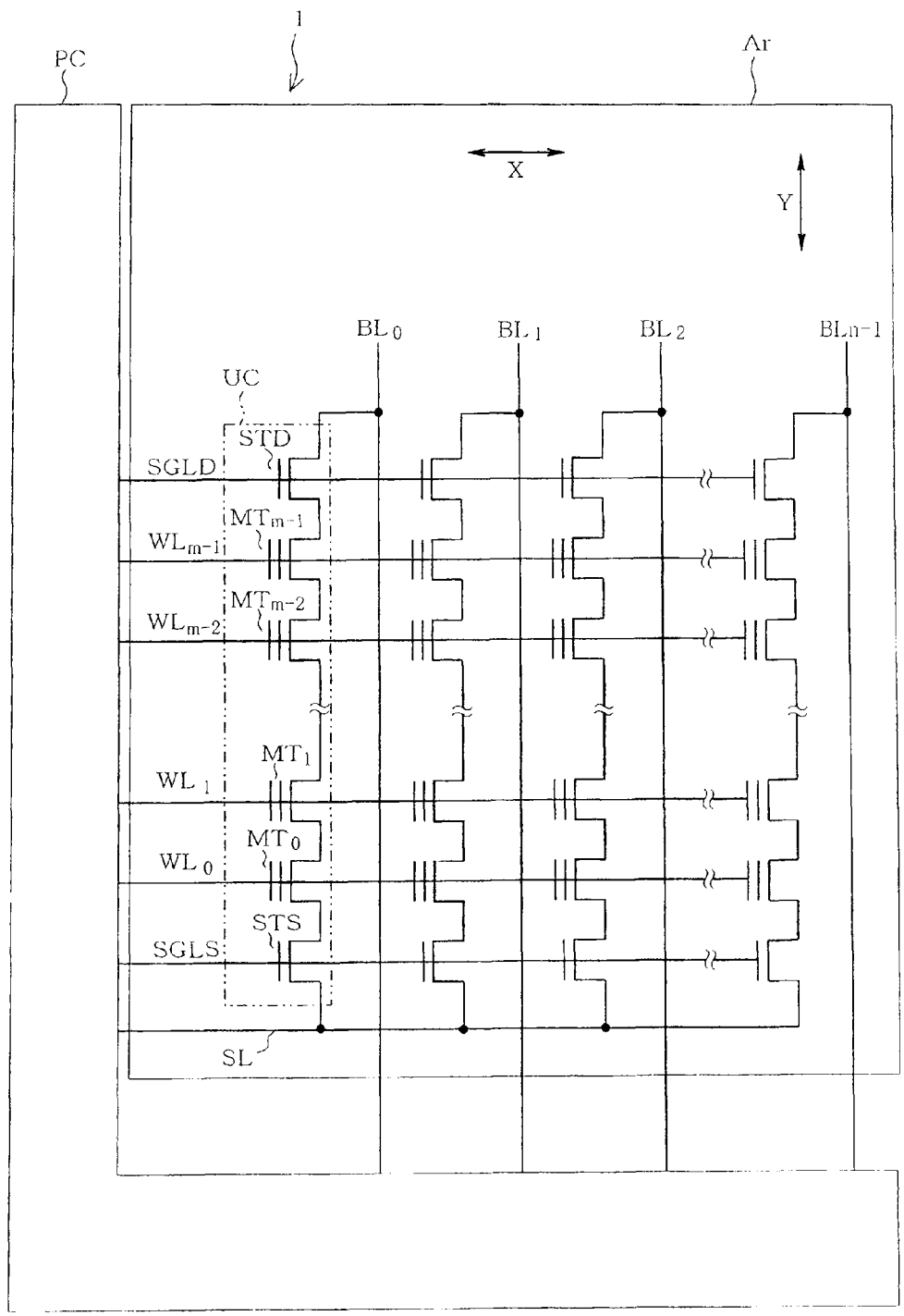
FIG. 1 is one schematic example of an electric configuration of a nonvolatile semiconductor storage device of a first embodiment.

In one embodiment, a nonvolatile semiconductor storage device is disclosed. The device includes a memory cell region including a memory cell having a charge storing layer above a gate insulating film and a control electrode stacked above the charge storing layer via an interelectrode insulating film; and a peripheral circuit region including a peripheral element having a first polysilicon and a first insulating film stacked above the first polysilicon. The charge storing layer includes a polysilicon doped with P-type impurity, the polysilicon doped with the P-type impurity including a first upper region contacting the interelectrode insulating film, the first upper region having a first doped layer doped with carbon (C) or nitrogen (N), and at least a portion of a region below the first doped layer is neither doped with carbon (C) nor nitrogen (N). The first polysilicon includes a second upper region contacting the first insulating film, the second upper region having a second doped layer doped with carbon (C) or nitrogen (N), the second doped layer having a thickness equal to a thickness of the first doped layer.

In one embodiment, a method of manufacturing a nonvolatile semiconductor storage device including a memory cell region having a memory cell and a peripheral circuit region having a peripheral element is disclosed. The method includes forming a first insulating film above a semiconductor substrate located in the memory cell region and the peripheral circuit region; depositing a silicon film above the first insulating film so that carbon (C) or nitrogen (N) is doped in at least an upper region of the silicon film; forming element isolation trenches by dividing the silicon film deposited in the memory cell region and the peripheral circuit region; forming an element isolation film into the element isolation trenches in the memory cell region and the peripheral circuit region so as to cover sidewalls of the silicon film; etching an upper portion of the element isolation film in the memory cell region until a portion or an entirety of sidewalls of the silicon film neither doped with carbon (C) nor nitrogen (N) located in the memory cell region is exposed, and leaving the element isolation film along sidewalls of the silicon film neither doped with carbon (C) nor nitrogen (N) located in the peripheral circuit region; and doping a P-type impurity by vapor diffusion from an exposed surface of the silicon film located in the memory cell region.

In one embodiment, a nonvolatile semiconductor storage device is disclosed. The device includes a semiconductor substrate; a first gate insulating film formed above the semiconductor substrate; a memory cell region including a memory cell having a stack including a charge storing layer having a first width, a first cap film, an interelectrode insulating film, and a control electrode disposed above the first gate insulating film; and a dummy cell region including a first dummy cell having a first dummy charge storing layer having the first width disposed above the first gate insulating film, the interelectrode insulating film disposed above the first dummy charge storing layer via the first cap film, and the control electrode disposed above the interelectrode insulating film, and a second dummy cell disposed adjacent to the first dummy cell and having a second dummy charge storing layer having a second width greater than the first width disposed above the first gate insulating film, the interelectrode insulating film disposed above the second dummy charge storing layer via the second cap film, and the control electrode disposed above the interelectrode insulating film. The second cap film above the second dummy charge storage layer exists at least partially.

EMBODIMENTS

Embodiments are described hereinafter through a nonvolatile semiconductor storage device application such as NAND flash memory with references to the accompanying drawings. In the following descriptions, elements that are identical in function and structure are identified with identical reference symbols. The drawings are not drawn to scale and thus, do not reflect the actual measurements of the features such as the correlation of thickness to planar dimensions and the relative thickness of different layers. Further, directional terms such as up, upper, upward, down, lower, downward, left, leftward, right, and rightward are used in a relative context with an assumption that the worked surface, on which circuitry is formed, of the later described semiconductor substrate faces up. Thus, the directional terms do not necessarily correspond to the directions based on gravitational acceleration.

First Embodiment

FIG. 1 is one example of a block diagram schematically illustrating an electrical configuration of a NAND flash memory device. It can be seen from FIG. 1 that the NAND flash memory device is provided with memory cell array Ar and peripheral circuit PC. Peripheral circuit PC reads/programs/erases each of the memory cells of memory cell array Ar.

Memory cell array Ar includes multiplicity of units of cells also referred to as cell unit UC. Cell unit UC comprises a $2^k$ number of memory cell transistors $MT_0$ to $MT_{m-1}$ (corresponding to memory cells and hereinafter represented as MT), such as 64 in number, situated between a couple of select transistors STD and STS. Select transistor STD is connected to a bit lines $BL_0$ to $BL_{n-1}$ and select transistor STS is connected to source line SL. A dummy transistor may be provided between select transistor STD and memory cell transistor MT and between select transistor STS and memory cell transistor MT.

The X-direction aligned memory cells MT shown in FIG. 1 are interconnected by common word line WL. Thus, the X direction is hereinafter also referred to as a word line direction. The X-direction aligned select transistors STD are interconnected by common select gate line SGLD. The X-direction aligned select transistors STS are interconnected by common select gate line SGLS. The drain of each select transistor STD is coupled to bit line BL extending in the Y direction as viewed in FIG. 1 by way of bit line contact. Thus, the Y direction is also hereinafter referred to as a bit line direction. The sources of select transistors STS in 1 block, for example, are connected to a common source line SL.

Figure 2:
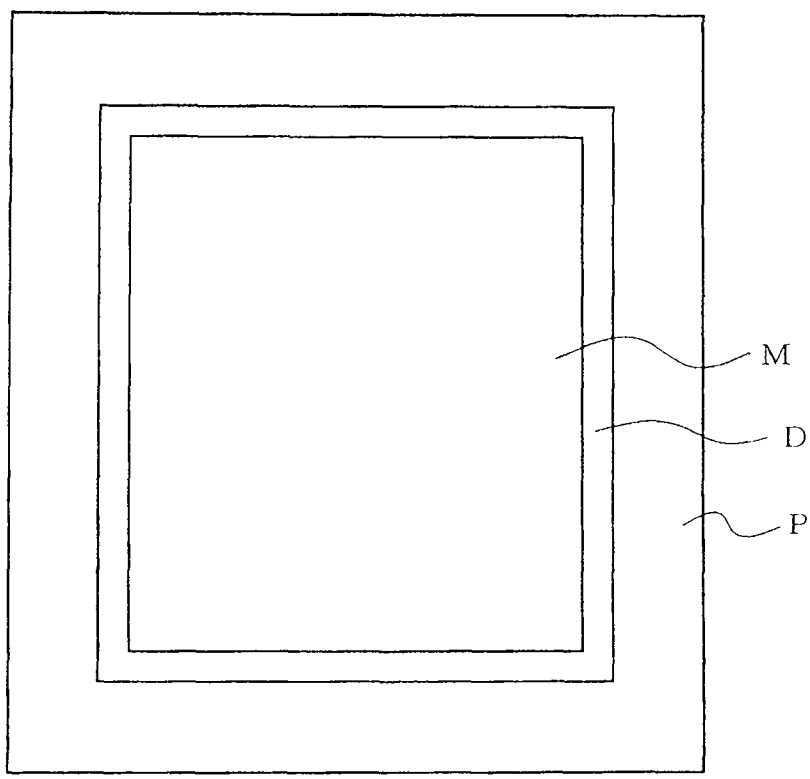
FIG. 2 is one example of a plan view illustrating the overall layout of the first embodiment.

FIG. 2 illustrates one example of a planar layout of the regions within the NAND flash memory. As shown in FIG. 2, memory cell region M is configured as a rectangular or square region being surrounded by peripheral circuit region P shaped like a rectangular frame. Dummy cell region D may be provided between peripheral circuit region P and memory cell region M. The aforementioned memory cell transistors MT are formed in memory cell region M. Various transistors (p-channel type MOS transistor, n-channel type MOS transistor) such as a high level voltage transistor and a low level voltage transistor for driving memory cells MT are formed in peripheral circuit region P. Dummy cells DM which are not electrically functional may be provided in dummy region D. Dummy cell DM will be described in detail in subsequent embodiments.

Figure 3:
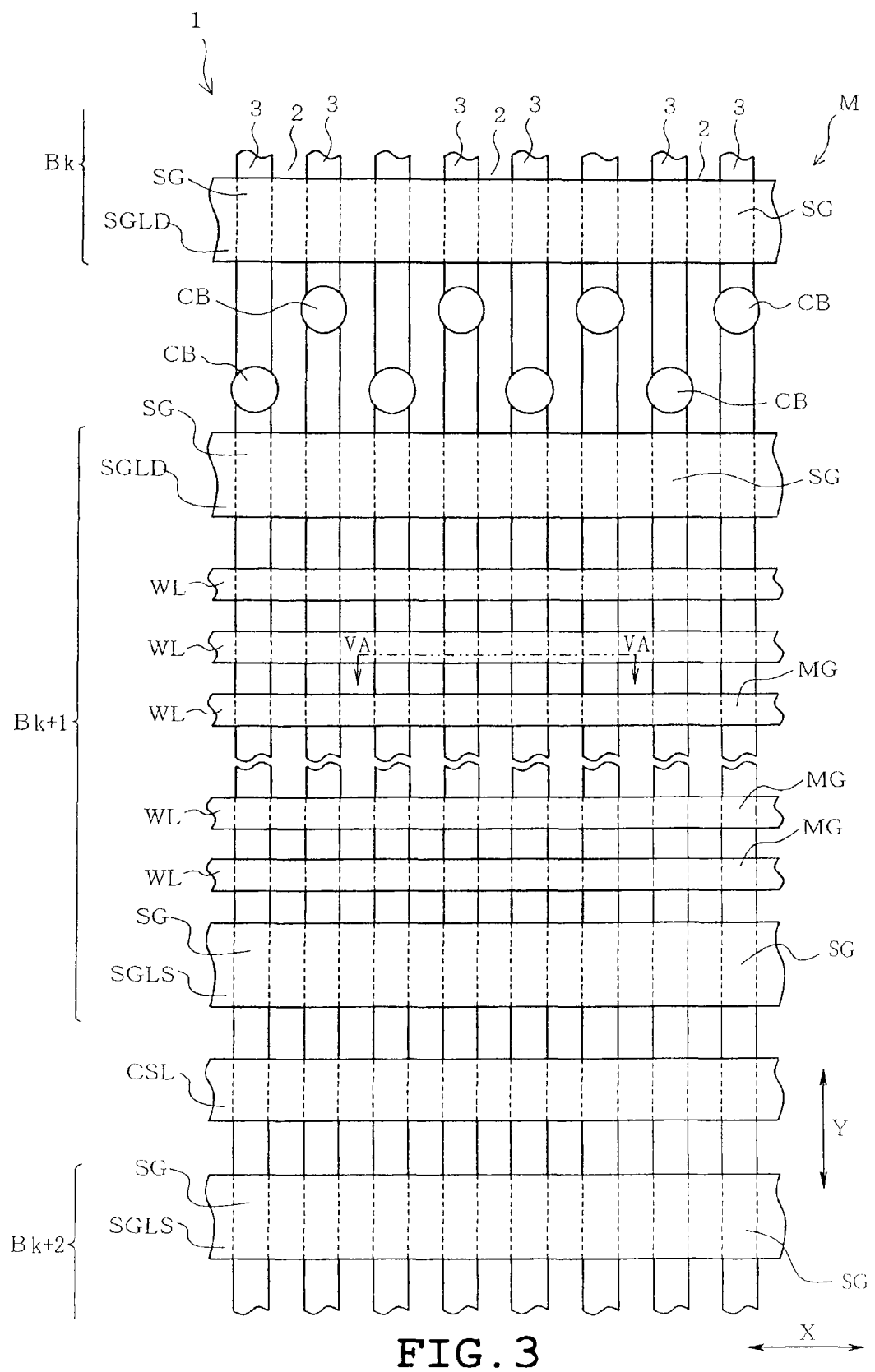
FIG. 3 is one schematic example of a plan view partially illustrating a memory cell region of the first embodiment.
Figure 4:
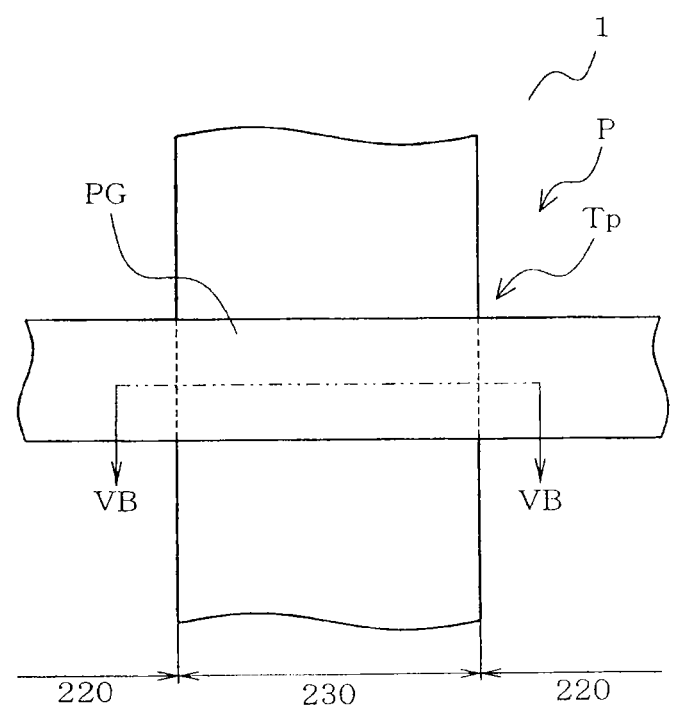
FIG. 4 is one schematic example of a plan view partially illustrating a peripheral circuit region of the first embodiment.

FIG. 3 partially illustrates one example of a planar layout of memory cell region M. FIG. 4 partially illustrates one example of a planar layout of peripheral circuit region P. In memory cell region M, multiplicity of element isolation regions 2 run in the Y direction of semiconductor substrate 1 as shown in FIG. 3. Element isolation regions 2 are spaced from one another in the X-direction by a predetermined spacing to form multiple element regions 3 divided in the X direction.

Select gate line SGLD interconnecting select transistors STD extend along the X direction which is the direction in which the word line extends. A region for forming bit line contacts CB are provided between select gate lines SGLD of Y-directionally adjacent blocks $B_k$ and $B_{k+1}$ as viewed in FIG. 2. In each of element regions 3 located between a pair of select gate lines SGLD, bit line contact CB is formed. Select gate line SGLS interconnecting select transistors STS extend along the X direction.

In memory cell region M shown in FIG. 3, gate electrode MG of memory cell MT is formed above element region 3 intersecting with word line WL. Select gate electrode SG of select transistor STD is formed above element region 3 intersecting with select gate line SGLD. Select gate electrode SG of select transistor STS is formed above element region 3 intersecting with select gate line SGLS.

In peripheral circuit region P shown in FIG. 4, element isolation regions 220 taking an STI structure are formed into semiconductor substrate 1. As a result, islands of element regions 230 are isolated from one another by element isolation regions 220. Gate electrode PG is formed so as to extend across element region 230. Transistor Tp of peripheral circuit region P includes gate electrode PG and a drain/source region formed in the surface layer of element region 230 of semiconductor substrate 1 located beside gate electrode PG.

Figure 5A:
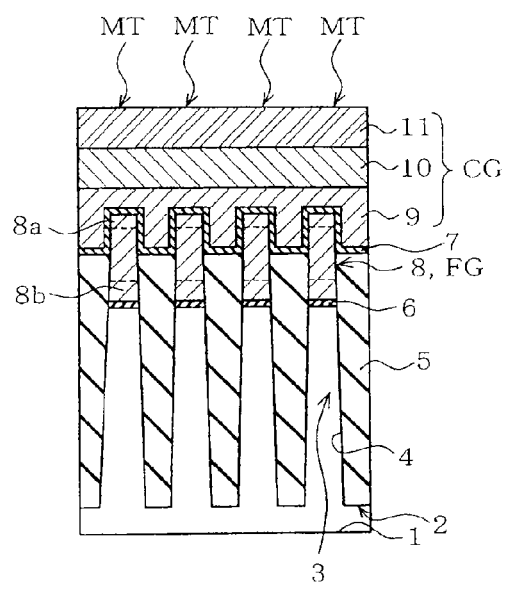
FIG. 5A is one schematic example of a vertical cross-sectional view taken along line VA-VA of FIG. 3 of the first embodiment.

As schematically shown in the cross sectional view of memory cell region M in FIG. 5A, element isolation trenches 4 are formed into semiconductor substrate 1. Element isolation trenches 4 are filled with element isolation film 5. Element isolation region 2 taking an STI structures is configured as described above. Element isolation region 3 is provided between the adjacent element isolation regions 2. Each of memory cells MT comprises a stack of gate insulating film, floating electrode FG, interelectrode insulating film 7, and control electrode CG above element region 3. Floating electrode FG serves a charge storing layer.

Floating electrode FG comprises polycrystalline silicon film 8 heavily doped with P-type impurities such as boron (B). The lower side surface of floating electrode FG is covered by element isolation film 5 and the upper side surface as well as the upper surface are covered by interelectrode insulating film 7. Interelectrode insulating film 7 is an insulating film located between floating electrode FG and control electrode CG and may also be referred to as an interpoly insulating film or interconductive layer insulating film.

Interelectrode insulating film 7 may comprise a so called ONO (Oxide-Nitride-Oxide) film configured by a stack of oxide film/nitride film/oxide film; or, a so called NONON (Nitride-Oxide-Nitride-Oxide-Nitride) film configured by a stack of nitride film/oxide film/nitride film/oxide film/nitride film; or, a so called NONO film (Nitride-Oxide-Nitride-Oxide film) configured by a stack of nitride film/oxide film/ nitride film/oxide film/nitride film/oxide film; or, a so called ONON film (Oxide-Nitride-Oxide-Nitride) configured by a stack of oxide film/nitride film/oxide film/nitride film. The intermediate nitride film of the stack may be replaced by a high dielectric constant film having a higher relative dielectric constant than the nitride film. The nitride film may be replaced by an oxynitride film having high oxygen content. Control electrode CG is provided above interelectrode insulating film 7 and comprises polysilicon films 9 and 10 doped with impurities and low resistance metal film 11 formed above polysilicon films 9 and 10.

Memory cell MT is capable of nonvolatile storage of data by controlling the state of charge storage in floating electrode FG. For instance, when the threshold voltage of the floating electrode, being injected with electrons through the channel, is high, memory cell MT associates such state with data "0". When the threshold voltage of the floating electrode, having released electrons into the channel, is low, memory cell MT associates such state with data "1". Memory cell MT stores either of data 0 or data 1. Multi-value storage scheme that stores quaternary or octary values, etc. may be employed by refining the control of threshold distribution.

Work function can be increased when the conductivity type of the impurities introduced into floating electrode FG is a P type. When the conductivity type of the impurities introduced into polysilicon film 8 of floating electrode FG is a P type, field concentration occurs at the interface between floating electrode FG and interelectrode insulating film 7 and the interface region becomes depleted when high positive voltage is applied to control electrode CG by peripheral circuit PC during programming.

It has been found that when peripheral circuit PC increases the voltage level of control electrode CG during programming, the depletion causes a sudden increase of threshold voltage of memory cell MT in some areas. As a result, it becomes difficult to set the target distribution range to the threshold voltage distribution of memory cell MT. Programming error may occur especially when memory cell MT is operating as a multi-level cell.

In the first embodiment, carbon (C) is introduced into floating electrode FG (polysilicon film 8a) especially at the contacting interface with the overlying interelectrode insulating film 7. Though floating electrode FG is formed of polysilicon film 8 heavily doped with P-type impurities, crystal defects can be increased by introducing carbon (C) in its upper portion. As a result, it is possible to reduce the diameters of crystal grains in the upper polycrystalline silicon film 8a and increase the number of grain boundaries. Thus, it is possible to inhibit depletion near the contact interface between floating electrode FG and interelectrode insulating film 7. As a result, it is possible to increase generation-recombination rate of electrons in floating electrode FG and inhibit programming errors.

In contrast, when memory cells MT are erased by peripheral circuit PC, electrons in floating electrode FG can be released into P-well region not shown by FN (Fowler-Nordheim) current by applying positive high electric field to the P-well region not shown located in the surface layer of semiconductor substrate 1. In such case, the contact interface region between floating electrode FG and gate insulating film 6 become depleted.

Thus, for the reasons described above, carbon (C) is preferably doped in the interface portion between polysilicon film 8b and gate insulating film 6 located in the lower portion of floating electrode FG. Thus, it is possible to increase the crystal defects in polycrystalline silicon film 8b located in the lower portion of floating electrode FG and reduce the crystal grain diameters of polycrystalline silicon film 8b. As a result depletion can be inhibited. The concentration of carbon (C) introduced in the region between upper portion 8a and lower portion 8b of floating electrode FG is lower than the concentration of carbon (C) in upper portion 8a and in lower portion 8b of floating gate electrode FG, or is ignorably small.

Figure 5B:
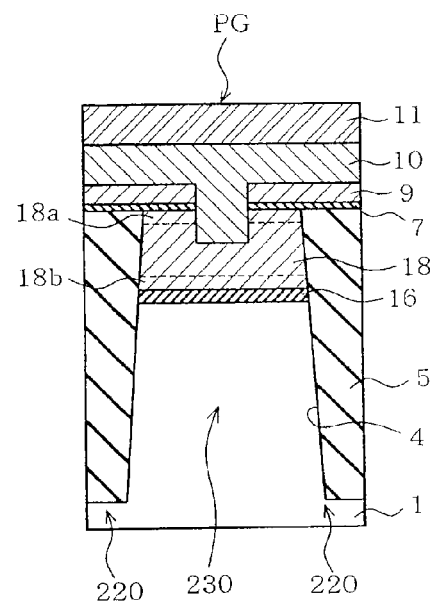
FIG. 5B is one schematic example of a vertical cross-sectional view taken along line VB-VB of FIG. 4 of the first embodiment.

FIG. 5B is one schematic example of a cross section of peripheral circuit region P taken along line VB-VB of FIG. 4.

As shown in FIG. 5B, gate insulating film 16 thicker than gate insulating film 6 is formed above element forming region 230 and polycrystalline silicon film 18 is formed above gate insulating film 16. Polycrystalline silicon film 18 is formed when polysilicon film 8 serving as the aforementioned floating electrode FG is formed. Polycrystalline silicon films 8 and 18 are formed in 3 steps using similar materials.

Polycrystalline silicon film 18 is formed so that its upper surface is substantially coplanar with the upper surface of element isolation film 5. Interelectrode insulating film 7 is formed above element isolation film 5 and polysilicon film 18. Polysilicon films 9 and 10 and low resistance metal film 11 are stacked above interelectrode insulating film 7. Carbon (C) is introduced into upper portion 18a and lower portion 18b of polysilicon film 18.

The height in which carbon (C) is introduced into polysilicon film 18 of peripheral circuit region P is equal to the height in which carbon (C) is introduced into polysilicon film 8 of floating electrode FG. The concentration of carbon (C) introduced in the region between upper portion 18a and lower portion 18b of polysilicon film 18 is lower than the concentration of carbon (C) in upper portion 18a and in lower portion 18b of polysilicon film 18, or is ignorably small.

The thickness of upper portion 8a of floating electrode FG and thickness of upper portion 18b of polysilicon film 18b are substantially equal when measured in the direction perpendicular to the main plane of semiconductor substrate 1, in other words, the direction in which the films are stacked. The thickness of lower portion 8b of floating electrode FG and thickness of lower portion 18b of polysilicon film 18b are substantially equal when measured in the direction perpendicular to the main plane of semiconductor substrate 1, in other words, the direction in which the films are stacked.

The thickness of upper portions 8a and 18a indicates the thickness measured from the upper surface of floating electrode FG to the detection limit of carbon (C) or nitrogen (N). Similarly, the thickness of lower portions 8b and 18b indicates the thickness measured from the under surface of floating electrode FG to the detection limit of concentration of carbon (C) or nitrogen (N).

Referring to FIGS. 6A to 11B, description will be given in sequence on each process step of the manufacturing process flow for obtaining the structure of the first embodiment.

The following descriptions will focus on the features of each process step of the manufacturing process flow and thus, known steps may be added. The figures suffixed by A each schematically illustrate one manufacturing phase of the structures in memory cell region M and figures suffixed by B each schematically illustrate one manufacturing phase of the structures in peripheral circuit region P.

As shown in FIGS. 6A and 6B, gate insulating films 6 and 16 are formed above portions of semiconductor substrate 1 located in memory cell region M and peripheral circuit region P by thermal oxidation. Gate insulating film 6 in memory cell region M may comprise a silicon oxide film and is used as a tunnel insulating film. A thick gate insulating film 16 is formed in a region in peripheral circuit region P where high-level voltage transistors are to be formed. Then, silicon films 8 and 18 are deposited simultaneously above gate insulating films 6 and 16 by CVD (Chemical Vapor Deposition). Silicon films 8 and 18 are represented by different reference symbols for ease of explanation; however, silicon films 8 and 18 are formed simultaneously.

Silicon films 8 and 18 are formed by CVD in 3 steps. In the first step, for example, silicon films 8b and 18b containing P type impurities such as boron (B) (also referred to as a first impurity) and containing carbon (C) are deposited by CVD.

In the second step, for example, silicon films 8c and 18c containing P type impurities such as boron are deposited by CVD In the third step, for example, silicon films 8a and 18a containing P type impurities such as boron and containing carbon (C) are deposited again by CVD. When depositing silicon containing carbon (C) by CVD, a film forming gas including silane and ethylene may be used.

Silicon films 8 and 18 which are amorphous immediately after their formation are transformed into polysilicon films 8 and 18 by thermal treatment performed later in the process flow. As a result, it is possible to form silicon films 8 and 18 having layers in which profiles of added elements differ from one another. Because silicon films 8b and 18b are formed simultaneously, the distributions of impurity concentration of carbon (C) in silicon film 8b and silicon film 18b are substantially equal. Because silicon films 8a and 18a are formed simultaneously, the distributions of impurity concentration of carbon (C) in silicon film 8a and silicon film 18a are substantially equal.

As shown in FIGS. 7A and 7B, insulating layers 20 and 21 used as hard masks are formed one over the other above polysilicon films 8 and 18 by methods such as CVD. The lower insulating layer 20 comprises silicon nitride film 20 and upper insulating layer 21 comprises silicon oxide film 21.

As shown in FIGS. 8A and 8B, resist 22 is coated above insulating layers 20 and 21 and resist 22 is patterned by photolithography.

As shown in FIGS. 9A and 9B, using the patterned resist 22 as a mask, insulating layers 21 and 20, polysilicon films 8 and 18, gate insulating films 6 and 16, and upper portion of semiconductor substrate 1 are anisotropically etched one after another to form element isolation trench 4. Element isolation trench 4 may be formed in a width beyond the limit of a normal lithography technique by using double patterning techniques such as a sidewall transfer method.

As shown in FIGS. 10A and 10B, liner oxide film (not shown) is formed along the inner surface of element isolation trench 4. Then, polysilazane solution is coated over the liner oxide film and heated. As a result, polysilazane is transformed into a silicon oxide film to form element isolation film 5.

Using silicon nitride film 20 as a stopper, element isolation film 5 is planarized, and using RIE (reactive ion etching), the elevation of the upper surface of element isolation film 5 is controlled to the target elevation located above the upper surface of semiconductor substrate 1 and below the upper surface of polysilicon film 8 as shown in FIG. 10A. The upper surface of element isolation film 5 is etched so that at least a portion or the entirety of sidewalls of polysilicon film 8c is exposed. Then, silicon nitride film 20 is removed by being wet etched by hot phosphoric acid.

Figure 12A:
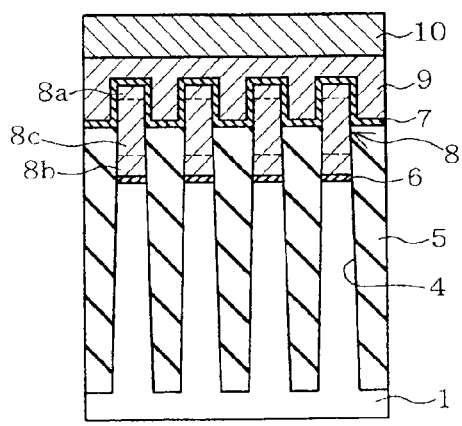
Figure 12B:
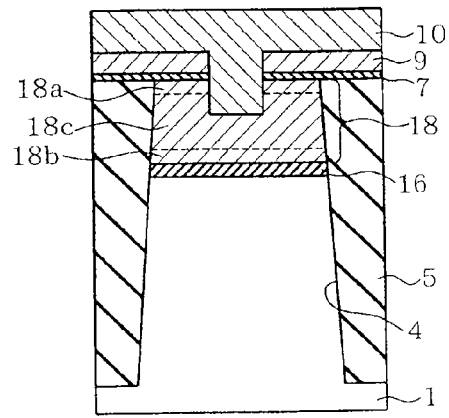

As shown in FIGS. 11A and 11B, interelectrode insulating film 7 comprising an ONO film or the like is deposited by CVD. As shown in FIGS. 12A and 12B, after depositing a thin silicon film 9, a resist not shown is coated over silicon film 9 and patterned. Then, using the patterned resist as a mask, an opening is formed through silicon film 9 and interelectrode insulating film 7 located in peripheral circuit region P by anisotropic etching. Thereafter, the resist pattern is removed and silicon film 10 is deposited in the opening by CVD.

As shown in FIGS. 5A and 5B, tungsten (W) film, serving as a low resistance metal film 11, is formed. Though not shown, interlayer insulating film or the like are further deposited. Then, in memory cell region M, low resistance metal film 11, polysilicon film 10, interelectrode insulating film 7, and polysilicon film 8 are isolated in the direction perpendicular to the surface illustrated in FIG. 5A. Subsequent process steps not described herein.

In the first embodiment, because carbon (C) is introduced into the upper polysilicon film 8a of floating electrode FG, it is possible to increase crystal defects near the contact interface of floating electrode FG and interelectrode insulating film 7. As a result, it is possible to reduce the crystal grain diameters of polysilicon film 8a and inhibit depletion.

Because carbon (C) is introduced in polycrystalline silicon film 8b in the lower region of floating electrode FG, it is possible to increase crystal defects near the contact interface of floating electrode FG and gate insulating film 6. As a result, it is possible to reduce the crystal grain diameter of polysilicon film 8a and inhibit depletion.

In the formation of floating electrode FG described above, carbon (C) is introduced into silicon film 8b in the first step and into silicon film 8a in the third step. Nitrogen (N) may be introduced instead of carbon (C), or nitrogen (N) may be introduced in addition to carbon (C). When depositing silicon films 8b and 8a containing nitrogen (N), silane and ammonia ($NH_3$) are preferably used in the film forming gas.

In the manufacturing process flow of the first embodiment, it is possible to introduce nitrogen (N) or carbon (C) when depositing silicon films 8a, 8b, 18a, and 18b. As a result, it is possible to prevent external diffusion of boron (B) in less number of process steps as compared to the conventional process flow. Thus, it is possible to improve the concentration of P type impurities especially in polysilicon film 8 located in the memory cell region M.

Further, silicon film 8 serving as floating electrode FG in memory cell region and silicon film 18 constituting a portion of the gate electrode of transistor Tp in peripheral circuit region P are formed into a similar structure in the same process step. As a result, it is possible prevent external diffusion of boron (B) in small number of process steps and improve the concentration of P-type impurities especially in polysilicon film 8 located in memory cell region M.

In the first embodiment, carbon (C) and nitrogen (N) are introduced into the lower region of floating electrode FG. Alternatively, carbon (C) and nitrogen (N) may be introduced in the upper region of floating electrode FG and not in the lower region. Gate electrode PG of peripheral circuit region P in the first embodiment may be doped with N type impurities. Such structure will be described in the second embodiment.

Second Embodiment

FIGS. 13 to 22C illustrate a second embodiment which differs from the first embodiment in the method of forming resistor element Ra in peripheral circuit region P. Various circuits such as a logical circuit and a step-up voltage circuit are formed in peripheral circuit P and resistor element Ra is a component of such circuits.

Figure 13:
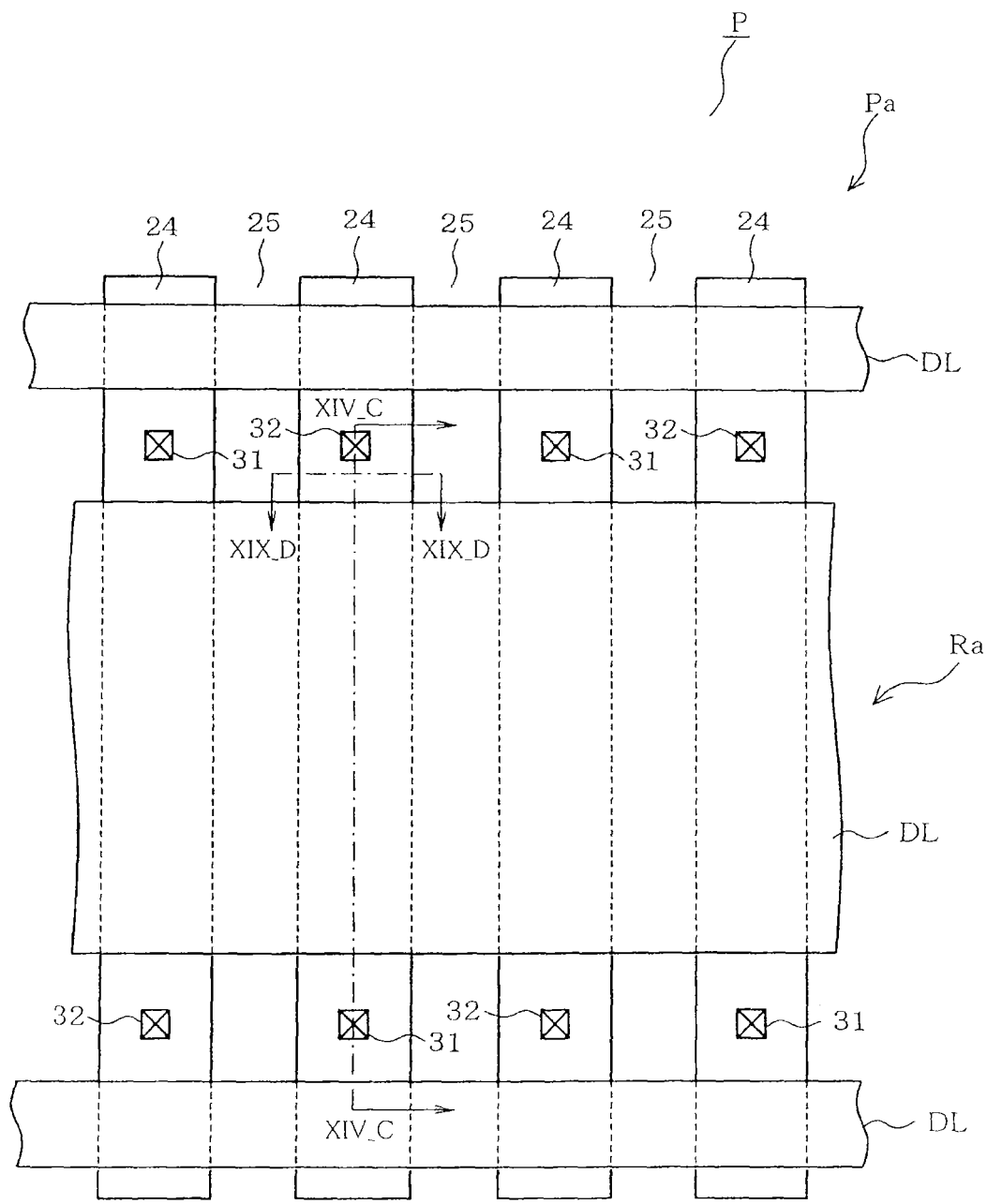
FIG. 13 is one example of a plan view schematically illustrating a resistor element of a second embodiment.

As shown in FIG. 13 illustrating an example of a planar view of region Pa for forming resistor element Ra located in peripheral circuit region P, element regions 24 are formed along a first direction. The element regions 24 are aligned in a second direction crossing the first direction. Element regions 24 are isolated by element regions 25.

Dummy lines DL associated with word lines WL described in the first embodiment are formed so as to cross perpendicularly for example with element regions 24 and element isolation regions 25. Via plugs 31 and 32 are formed between dummy lines DL. Via plugs 31 and 32 connect element region 24 and the upper connection layer not shown. Dummy line DL comprises polysilicon films 9 and 10 and low resistance metal film 11.

Figures 14A, 14B:
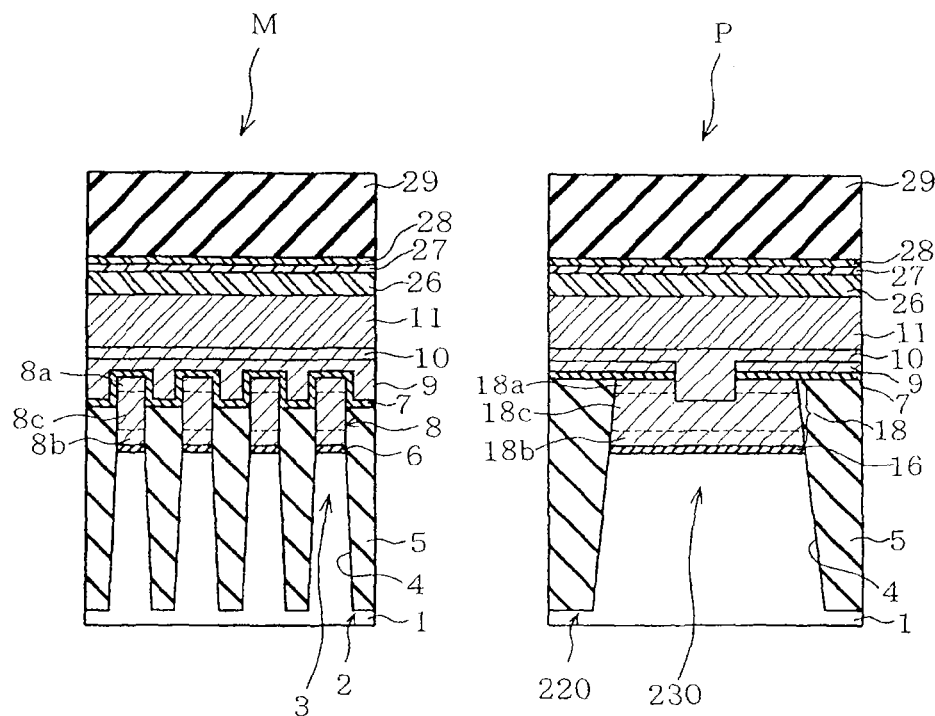
FIG. 14A is one schematic example of a vertical cross-sectional view taken along line VA-VA of FIG. 3 of the second embodiment.
FIG. 14B is one schematic example of a vertical cross-sectional view taken along line VB-VB of FIG. 4 of the second embodiment.
Figure 14C:
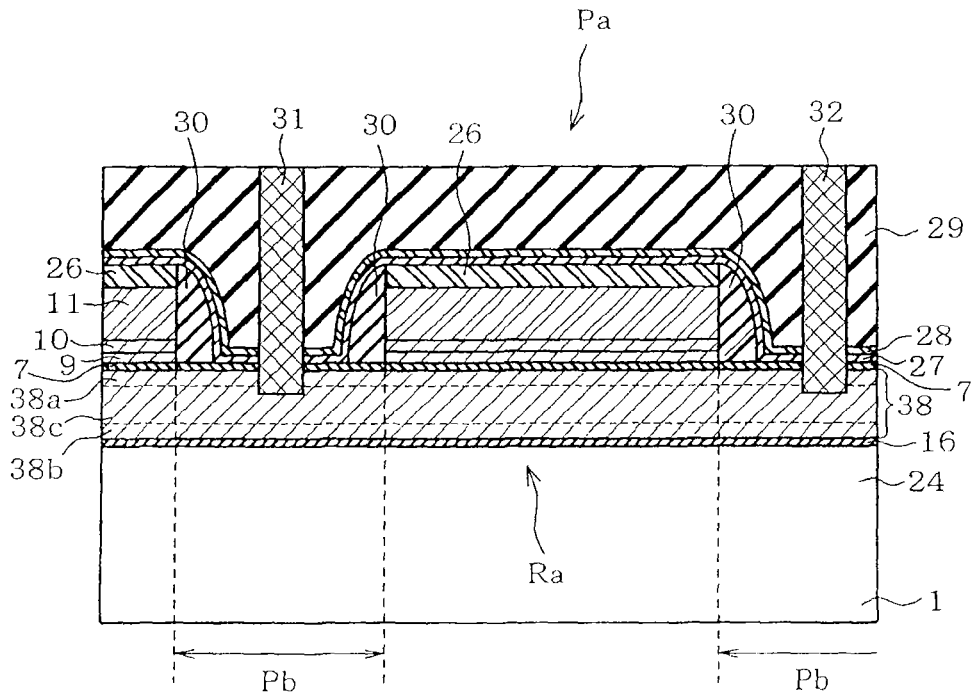
FIG. 14C is one schematic example of a vertical cross-sectional view taken along line XIV_C-XIV_C of FIG. 13 of the second embodiment.

FIG. 14C illustrates one schematic example of a cross section of resistor Ra taken along line XIV_C-XIV_C of FIG. 13. FIG. 14A corresponds to the schematic cross section taken along line VA-VA of FIG. 3 of memory cell MT in memory cell region M. FIG. 14B corresponds to the schematic cross section taken along line VB-VB of FIG. 4 of transistor Tp in peripheral circuit region P.

Though not shown in the descriptive view such as FIGS. 5A and 5B of the first embodiment, cap film 26 comprising a silicon nitride film, liner film 27 comprising a silicon oxide film, and silicon nitride film 28 serving as a stopper film are disposed one over the other above low resistance metal film 11 in regions M and P.

In the region for forming resistor Ra shown in FIG. 14C, gate insulating film 16 is formed above element region 24. Above gate insulating film 16, polysilicon film 38 doped with N type impurities such as phosphorous (P), interelectrode insulating film 7, polysilicon films 9 and 10, low resistance metal film 11, and cap film 26 are disposed one over the other.

Among the above described films, polysilicon films 9 and 10, low resistance metal film 11, and cap film 26 are isolated into multiple stacked structures in the cross section illustrated in FIG. 14C. In isolated region Pb, spacer film 30 is formed along each of sidewalls of the stacked structure including films 9 to 11 and 26. Further, liner film 27 and silicon nitride film 28 are formed along the upper surfaces of cap film and spacer films 30 and along the upper surface of interelectrode insulating film 7 in isolated region Pb. Interlayer insulating film 29 is formed above liner film 27 and silicon nitride film 28.

In isolated region Pb, via plugs 31 and 32 extend through interlayer insulating film 29, liner film 27, and silicon nitride film 28 and into polysilicon film 38 to establish contact with polysilicon film 38. Above gate insulating film 16 of isolated region Pb, triple layers 38b, 38c, and 38a of polysilicon film 38 are formed in the same layer level as floating electrode FG described in the first embodiment. Polysilicon film 38 between via plugs 31 and 32 serves as the main resistive element of resistor Ra.

As shown in FIG. 14C which may be associated with the first embodiment, carbon (C) is introduced into the lower polysilicon film 38b and upper polysilicon film 38a. However, carbon (C) is not introduced into the middle polysilicon film 38c.

The inventors have found that the resistance of resistor Ra increases excessively at the level of 1 kΩ or greater per unit length when P type impurities such as boron (B) and carbon (C) for example are introduced throughout polysilicon film 38 of resistor Ra. However, the inventors have further found that it is possible to substantially equate the resistance (per unit length) to a structure in which carbon is not introduced throughout polysilicon film 38 (amounting to approximately several hundred Ω per unit area) when polysilicon film 38 includes, in the stacking direction, a layer in which carbon is not introduced.

Accordingly, it is possible to substantially determine the resistance of resistor Ra by the presence of polycrystalline silicon film 38c in which carbon (C) is not introduced. Thus, it is possible to maintain the dimensions such as film thickness conventionally used in the design of resistor Ra. By adopting the above described structure, it is possible to realize resistor Ra having small resistance that enables accurate voltage division.

The under surfaces of via plugs 31 and 32 may be located inside polysilicon film 38a. This is because the thickness of polysilicon film 38a contacting the under surfaces of via plugs 31 and 32 is ignorably small.

Resistor Ra may be configured by polysilicon film 38 doped throughout with either of the N type or P type impurities. In either case, it is preferable to provide a middle polysilicon film 38c in which carbon (C) is not introduced between upper polysilicon film 38a and lower polysilicon film 38b in which carbon (C) is introduced.

The thickness of upper portion 8a of floating electrode FG and thickness of upper layer polysilicon film 38a are substantially equal when measured in the direction perpendicular to the main plane of semiconductor substrate 1, in other words, the direction in which the films are stacked. The thickness of lower portion 8a of floating electrode FG and thickness of lower layer of polysilicon film 38b are substantially equal when measured in the direction perpendicular to the main plane of semiconductor substrate 1, in other words, the direction in which the films are stacked. The thickness of upper layer polysilicon film 38a indicates the thickness measured from the upper surface of polysilicon film 38 to the detection limit of the concentration of carbon (C) or nitrogen (N). Similarly, the thickness of lower layer polysilicon film 38b indicates the distance measured from the under surface of polysilicon film 38 to the detection limit of the concentration of carbon (C) or nitrogen (N).

The thickness of upper portion 18a of floating electrode FG may be substantially equal to the thickness of the upper layer polysilicon film 38a when measured in the direction perpendicular to the main plane of semiconductor substrate 1, in other words, the direction in which the films are stacked. Similarly, the thickness of lower portion 18b of floating electrode FG may be substantially equal to the thickness of the lower layer polysilicon film 38b when measured in the direction perpendicular to the main plane of semiconductor substrate 1, in other words, the direction in which the films are stacked.

In the second embodiment, floating electrode FG of memory cell region M comprises polysilicon film 8 doped with P-type impurities, and in peripheral circuit region P, polysilicon film 38 doped with N-type impurities and located in the same layer level as floating electrode FG in memory cell region M serves as the main resistive element of resistor Ra. Thus, the process flow for manufacturing such structure also requires ingenuity. The second embodiment adopts the following manufacturing process steps.

Referring to FIGS. 15A to 22C, description will be given in sequence on each process step of the manufacturing process flow. The following descriptions will focus on the features of each process step of the manufacturing process flow and thus, known steps may be added. Further, the under described process steps may be rearranged if practicable.

The figures suffixed by A schematically illustrate one manufacturing phase of the structures in memory cell region M and figures suffixed by B schematically illustrate one manufacturing phase of the structures in peripheral circuit region P. The figures suffixed by C schematically illustrate one manufacturing phase of region Pa for forming resistor Ra in peripheral circuit region P. FIG. 19D is one example of a cross sectional view taken along line XIX_D-XIX_D of FIG. 13 in the manufacturing phase indicated in FIGS. 19A to 19C.

First, as shown in FIGS. 15A to 15C, gate insulating films 6 and 16 are formed above portions of semiconductor substrate 1 located in peripheral circuit region P and memory cell region M by thermal oxidation. Gate insulating film 6 in memory cell region M may comprise a silicon oxide film and is used as a tunnel insulating film. Then, silicon films 8, 18, and 38 are deposited simultaneously above gate insulating films 6 and 16 by CVD (Chemical Vapor Deposition). Silicon films 8, 18, and 38 are represented by different reference symbols in each of the figures suffixed by A, B, and C for better understanding.

Silicon films 8, 18, and 38 each comprise a non-doped silicon that is neither doped by P-type nor N-type impurities. Carbon (C) is introduced in silicon films 8b, 18b, and 38b deposited in the first step and in silicon films 8a, 18a, and 38a deposited in the third step. Carbon (C) is not introduced in silicon films 8c, 18c, and 38c deposited in the second step. The silicon films are deposited simultaneously in each of the first, second, and third steps.

Because silicon films 8b, 18b, and 38b are formed simultaneously, the distributions of impurity concentration of carbon (C) are substantially equal between the silicon films. Similarly, because silicon films 8a, 18a, and 38a are formed simultaneously the distributions of impurity concentration of carbon (C) are substantially equal between the silicon films.

As shown in FIGS. 16A to 16C, resist is coated to form resist pattern 40 which is used to mask peripheral circuit region P. Using resist pattern 40 as a mask, P-type impurities such as boron (B) are introduced by ion implantation into the exposed surface of polysilicon film 8 located in memory cell region M.

Resist pattern 40 is removed and resist is coated again as shown in FIGS. 17A to 17C to form resist pattern 41 which is used to mask memory cell region M. Using resist pattern 41 as a mask, N-type impurities such as phosphorous (P) are introduced by ion implantation. Then, resist pattern 41 is removed and the impurities introduced into polysilicon films 8, 18, and 38 are evenly diffused and activated by RTA (Rapid Thermal Anneal).

The level of energy used in implanting P-type impurities into memory cell region M and implanting N-type impurities into peripheral circuit region P may be equal or unequal. As a result, it is possible to obtain different impurity profiles depending upon purpose.

Silicon nitride film, 20, silicon oxide film 21, and resist 22 described in the first embodiment are coated and patterned by photolithography in order to form masks for forming element regions 3 and 24. Using the patterned mask patterns, polysilicon films 8, 18 and 38, gate insulating films 6 and 16, and upper portion of semiconductor substrate 1 are anisotropically etched in the listed sequence to form element isolation trenches 4.

As shown in FIGS. 19A to 19D, element isolation film 5 is filled in element isolation trenches 4. Element isolation film 5 may comprise a coating-type silicon oxide film and/or silicon oxide film formed by CVD. Then, element isolation film 5 is annealed by RTA. Impurity concentration may be reduced during RTA by the external diffusion of impurities introduced into polysilicon films 8, 18, and 38.

Thereafter, using silicon nitride film 20 as a stopper, element isolation film 5 is planarized. Then, as shown in FIG. 19A, the upper surface of element isolation film 5 located in memory cell region M is etched back to an elevation located below the upper surface of polysilicon film 8 but above the upper surface of gate insulating film 6. Thereafter, silicon nitride film 20 is removed by being wet etched by hot phosphoric acid.

At this stage, the upper surface and the upper sidewalls of polysilicon film 8 are exposed in memory cell region M shown in FIG. 19A and the lower sidewalls of polysilicon film 8 are covered by element isolation film 5. In peripheral circuit region P shown in FIGS. 19B to 19D, only the upper surface of polysilicon film 18 is exposed and the sidewalls are completely covered by element isolation film 5.

After obtaining the above described structure, boron (B) is introduced into memory cell region M and peripheral circuit region P by vapor phase diffusion using $BCl_3$ gas for example as an impurity source gas. Through diligent research, the inventors have found that in layers 8a, 18a, and 38a obtained by introducing carbon (C) into polysilicon films 8, 18, and 38 are capable of inhibiting the adsorption or diffusion of P-type impurities to/in polysilicon films 8, 18, and 38 when P-type impurities such as boron (B) are introduced by vapor phase diffusion.

Figure 19E:
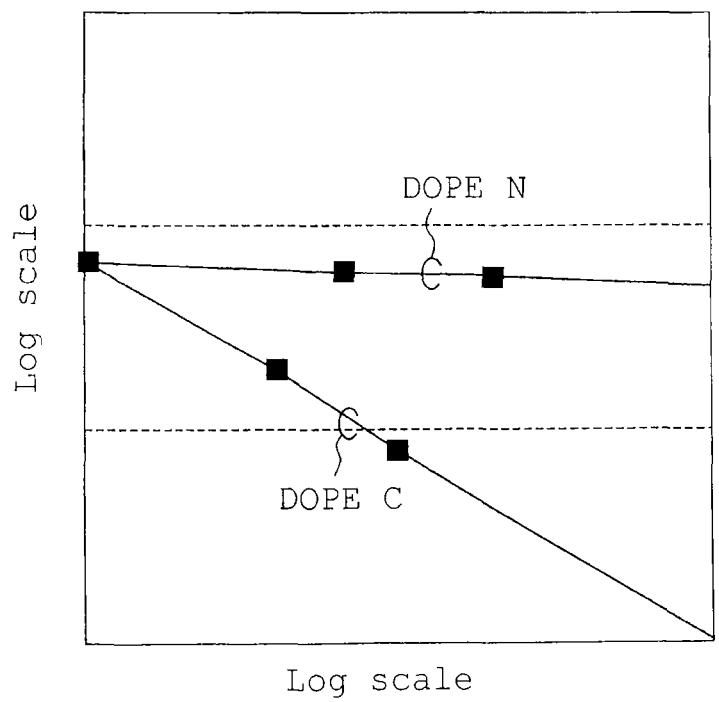
FIG. 19E is a one example of a chart indicating effectiveness of carbon (C) or nitrogen (N) in inhibiting adsorption of boron (B) in the second embodiment.

FIG. 19E is one example of a chart indicating effectiveness of carbon (C) or nitrogen (N) in inhibiting the adsorption of boron (B). The longitudinal axis of FIG. 19E indicates the concentration of boron adsorbed on the upper surface of polysilicon by the vapor gas flow and the horizontal axis indicates the concentration of carbon (C) or nitrogen (N) doped in polysilicon.

As shown in FIG. 19E, dose of boron (B) diffused in polysilicon decreases with the increase of carbon (C) concentration. The inventors think that carbon (C) is effective in inhibiting the adsorption of boron (B). The concentrations of remnant carbon (C) in polysilicon films 8, 18, and 38 are preferably equal to or greater than $4 \times 10^{20}$ [atoms/$cm^3$]. Carbon (C) introduced in the first and the second embodiments may be replaced by nitrogen (N) since nitrogen (N) is also effective in inhibiting adsorption of boron (B). It is also possible to introduce both carbon (C) and nitrogen (N).

In peripheral circuit region P, carbon (C) doped layers 18a and 38a cover the upper surfaces of polysilicon films 18 and 38 and element isolation film 5 covers the sidewalls of polysilicon films 18 and 38 as shown in FIGS. 19B and 19C. Thus, because carbon (C) doped layers 18a and 38a inhibit intrusion of boron (B), it is possible to inhibit introduction of boron (B) into polysilicon films 18 and 38 though boron (B) is adsorbed on the surface of polysilicon films 18 and 38.

In memory cell region M on the other hand, the upper surface of polysilicon film 8 is covered by carbon (C) doped layer 8a as shown in FIG. 19A. However, because the upper surface of element isolation film 5 is etched back in advance, boron (B) is adsorbed to polysilicon film 8 through the non-carbon-doped region (located in a portion or throughout the sidewalls of polysilicon film 8c) in the upper sidewalls of polysilicon film 8 located in memory cell region M. As a result, it is possible to selectively introduce boron (B) into polysilicon film 8 of memory cell region M and compensate for the impurities reduced by the external diffusion in the aforementioned thermal treatment step.

P-type impurities are additionally introduced into polysilicon film 8 located in memory cell region M but not in polysilicon film 38 used in resistor Ra located in peripheral circuit region P for the following reason.

As mentioned earlier, polysilicon film 8 in memory cell region M serves as floating electrode FG. Thus, it is possible to increase the work function and obtain desirable properties as the dose of P-type impurities increases.

On the other hand, resistor Ra of peripheral circuit region P has been set a target value of resistance. Further, the threshold value of transistor Tp in peripheral circuit region P is influenced by the concentration of impurities in polysilicon film 18. As a result, it may not be possible to set the resistance of resistor Ra to the target value and to control the threshold value of transistor Tp to the target threshold voltage when P-type impurities are additionally doped into polysilicon films 18 and 38 in concert with the memory cell. Boron (B) is additionally introduced into polysilicon film 8 but not into polysilicon films 18 and 38 for the above described reason.

Figures 20A, 20B:
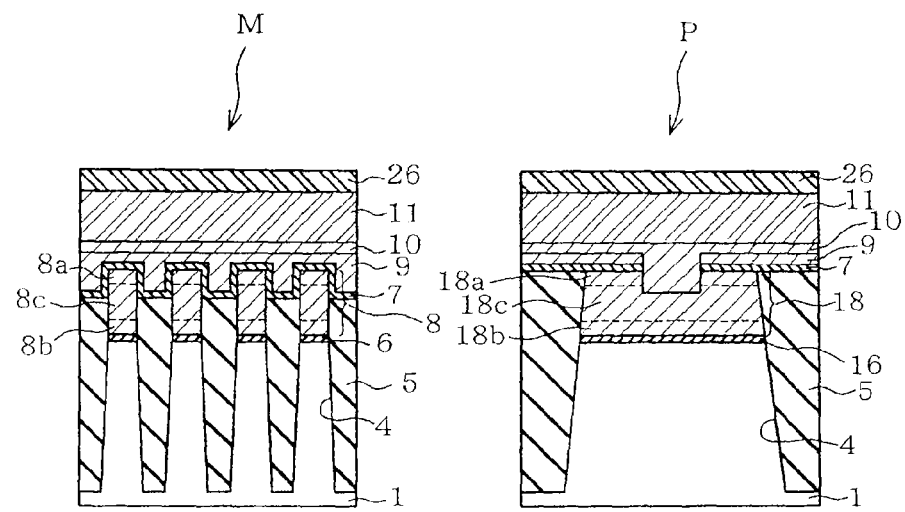
FIGS. 20A to 20C, 21A to 21C, and 22A to 22C are examples of vertical cross sectional views each schematically illustrating one phase of the manufacturing process flow of a portion corresponding to FIGS. 14A to 14C of the second embodiment.
Figure 20C:
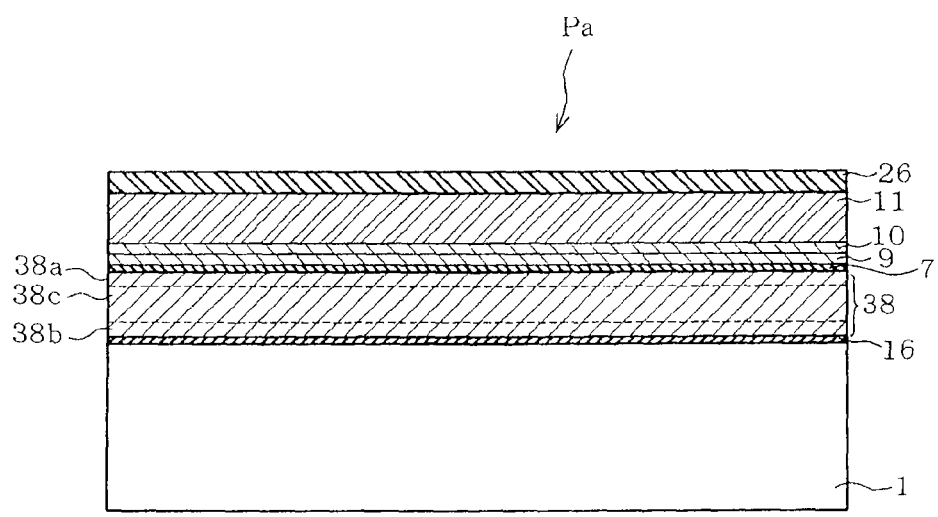
Figures 21A, 21B:
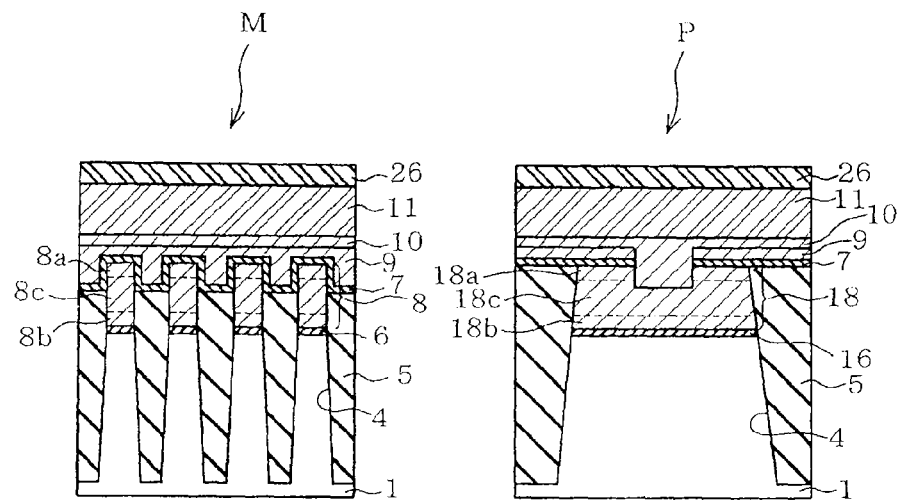
Figure 21C:
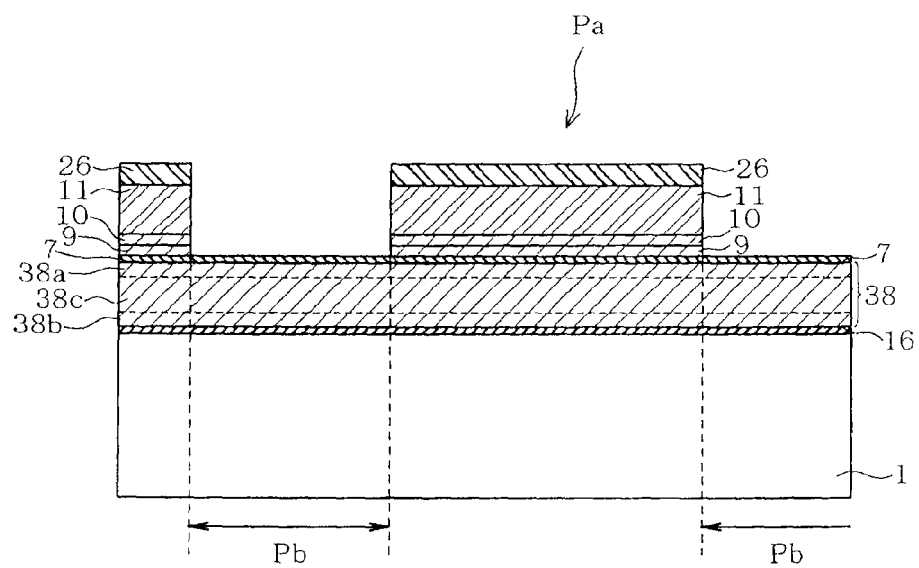

As shown in FIGS. 20A to 20C, interelectrode insulating film 7 and silicon film 9 are stacked one over the other by CVD. As shown in FIG. 20B, opening is formed through silicon film 9 and interelectrode insulating film 7 by etching. Then, silicon film 10, low resistance metal film 11, and cap film 26 comprising a silicon nitride film is stacked one over the other by CVD.

Resist not shown is formed above cap film 26 and patterned. Using the patterned resist as a mask, cap film 26, low resistance metal film 11, and silicon films 10 and 9 are anisotropically etched by RIE as shown FIGS. 21A to 21C and especially in FIG. 21C. As a result, the stack of films 9, 10, 11, and 26 is isolated into multiple stacked structures in isolation region Pb.

Figures 22A, 22B:
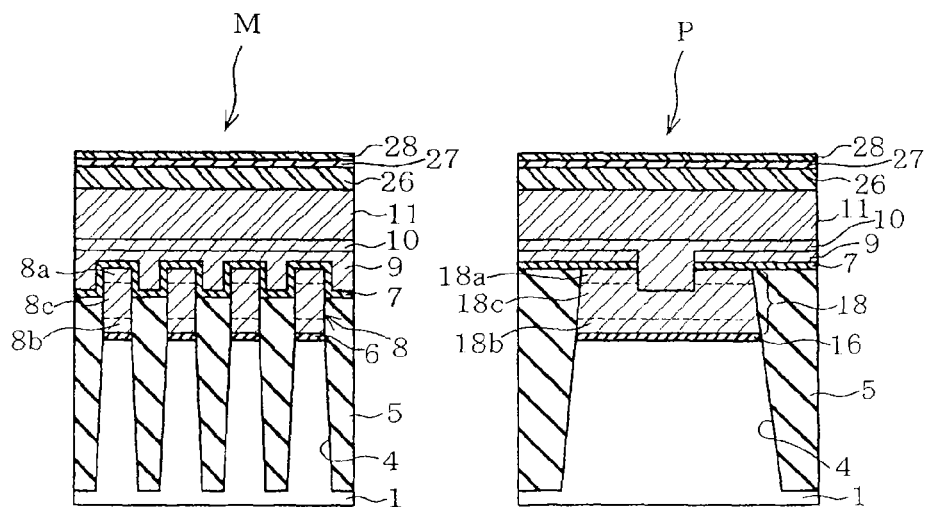
Figure 22C:
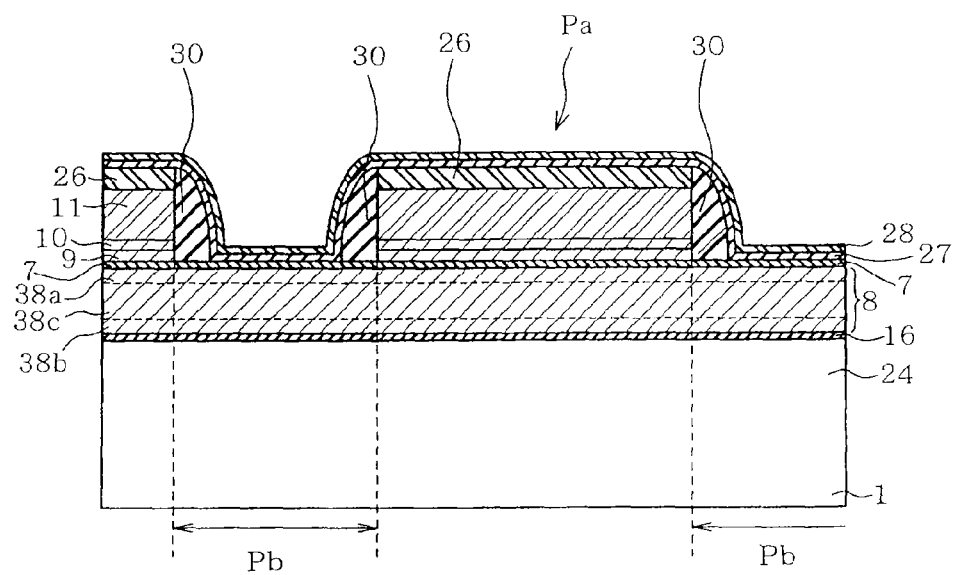

As shown FIGS. 22A to 22C and especially in FIG. 22C, a silicon oxide film is deposited by CVD and thereafter anisotropically etched so that the silicon oxide film remain as spacer films 30 along the sidewalls of the stacked structures. Liner film 27 is deposited above the upper surface of stacked structures including films 9, 10, 11, and 26, and the upper surfaces of spacer films 30 located in isolation region Pb and above interelectrode insulating film 7 located in the isolation region Pb. Silicon nitride film 28 is further deposited above liner film 27.

As shown in FIGS. 14A to 14C, interlayer insulating film 29 comprising a silicon oxide film is formed by CVD above silicon nitride film 28. Resist is formed above interlayer insulating film 29 and patterned. Using the patterned resist as a mask, a via hole is formed through interlayer insulating film 29 using silicon nitride film 28 as a stopper. The formation of via hole is temporarily stopped when reaching silicon nitride film 28. Then, the formation of the via hole continues through silicon nitride film 28, liner film 27, and interelectrode insulating film 7.

The via holes is formed so as to extend downward through polysilicon film 38a from the upper surface of polysilicon film 38a. The lowermost end of the via hole is preferably located approximately at the interface between polysilicon film 38a and 38c by controlling duration of via hole etching.

Material for forming via plugs 31 and 32 are filled in the via holes located in isolation region Pb. The lower ends of via plugs 31 and 32 are preferably located approximately at the interface of the upper polysilicon film 38a and the middle polysilicon film 38c among the three layers of polysilicon films 38b, 38c, and 38a. Via plugs 31 and 32 extend to polysilicon film 38c in which carbon is not introduced. As a result, the resistance of resistor Ra is not easily influenced by carbon.

In the second embodiment, because the impurities reduced by external diffusion during the thermal treatment are replenished in floating electrode FG of memory cell region M, it is possible to inhibit depletion of floating electrode FG. Further, because the sidewalls of polysilicon film 8c is partly or completely exposed before introducing boron (B) into polysilicon film 8 (especially polysilicon film 8c) of memory cell region M, it is possible to efficiently adsorb boron (B) on polysilicon film 8c and efficiently diffuse boron (B) inside polysilicon film 8.

On the other hand, because element isolation film 5 covers the sidewalls of polysilicon films 18 and 38 in this process step, boron (B) is not adsorbed on the side surfaces of polysilicon films 18 and 38. Boron (B) is adsorbed on the polysilicon films 18a and 38a serving as the carbon (C) doped layer in the upper portion of polysilicon films 18 and 38. As a result, it is possible to inhibit increase of boron (B) concentration in silicon films 18 and 38 located in peripheral circuit region P.

Gate electrode PG of transistor Tp located in peripheral circuit region P may be formed by polysilicon film 18 doped with N-type impurities and resistor Ra may be primarily formed by polysilicon film 38 doped with N-type impurities.

Especially because polysilicon film 38 has a non-carbon (C)-doped portion in its middle polysilicon film 38c, it is possible to inhibit increase in the resistivity of polysilicon film 38 and provide resistor Ra having appropriate resistance.

Because a process is used in which P-type impurities are not introduced into polysilicon films 18 and 38 in peripheral circuit region P, it is possible to inhibit increase of resistance of resistor Ra and control the resistance to the desired value.

Further, because an additional film for preventing the intrusion carbon (C) into polysilicon films 18 and 38 is not required, there is no difference in height between memory cell region M and peripheral circuit region P. As a result, it is possible to perform planarization of element isolation film 5 after filling element isolation film 5.

Because carbon (C) or nitrogen (N) is introduced during the deposition of silicon films 8a, 8b, 18a, 18b, 38a, and 38b, it is not required to additionally dope high dose of boron (B) by ion implantation after boron (B) is released by external diffusion. As a result, it is possible to dope boron (B) while preventing diffusion of boron (B) and thereby improve the concentration of P-type impurities in floating electrode FG of memory cell region M.

Because via plugs 31 and 32 extend to and contact polysilicon film 38c which is not doped with carbon (C), the resistance of resistor Ra is not easily influenced by carbon (C). As a result, it is possible to inhibit increase of resistance and control the resistance to the desired value more easily.

In the second embodiment, carbon is introduced into polysilicon films 8, 18, and 38. Alternatively, it is possible to introduce nitrogen (N) or introduce both carbon (C) and nitrogen (N).

When adopting a P-type polysilicon in polysilicon films 8, 18, and 38, a manufacturing process flow similar to the manufacturing process flow described in the first embodiment may be used. Thus, it is possible to adopt similar structures in silicon film 8 serving as floating electrode FG in memory cell region, in silicon film 18 constituting a portion of the gate electrode of transistor Tp in peripheral circuit region P, and in silicon film 38 constituting a portion of resistor Ra and form such structures in the same process step. As a result, it is possible prevent external diffusion of boron (B) in small number of process steps and improve the concentration of P-type impurities especially in polysilicon film 8 located in memory cell region M.

Third Embodiment

FIGS. 23 to 34 illustrate a third embodiment. The third embodiment differs from the foregoing embodiments in the manufacturing process flow of dummy cell region D and its peripheral regions. As shown in FIG. 2, dummy cell region D is provided between memory cell region M and peripheral circuit region P.

Figure 24:
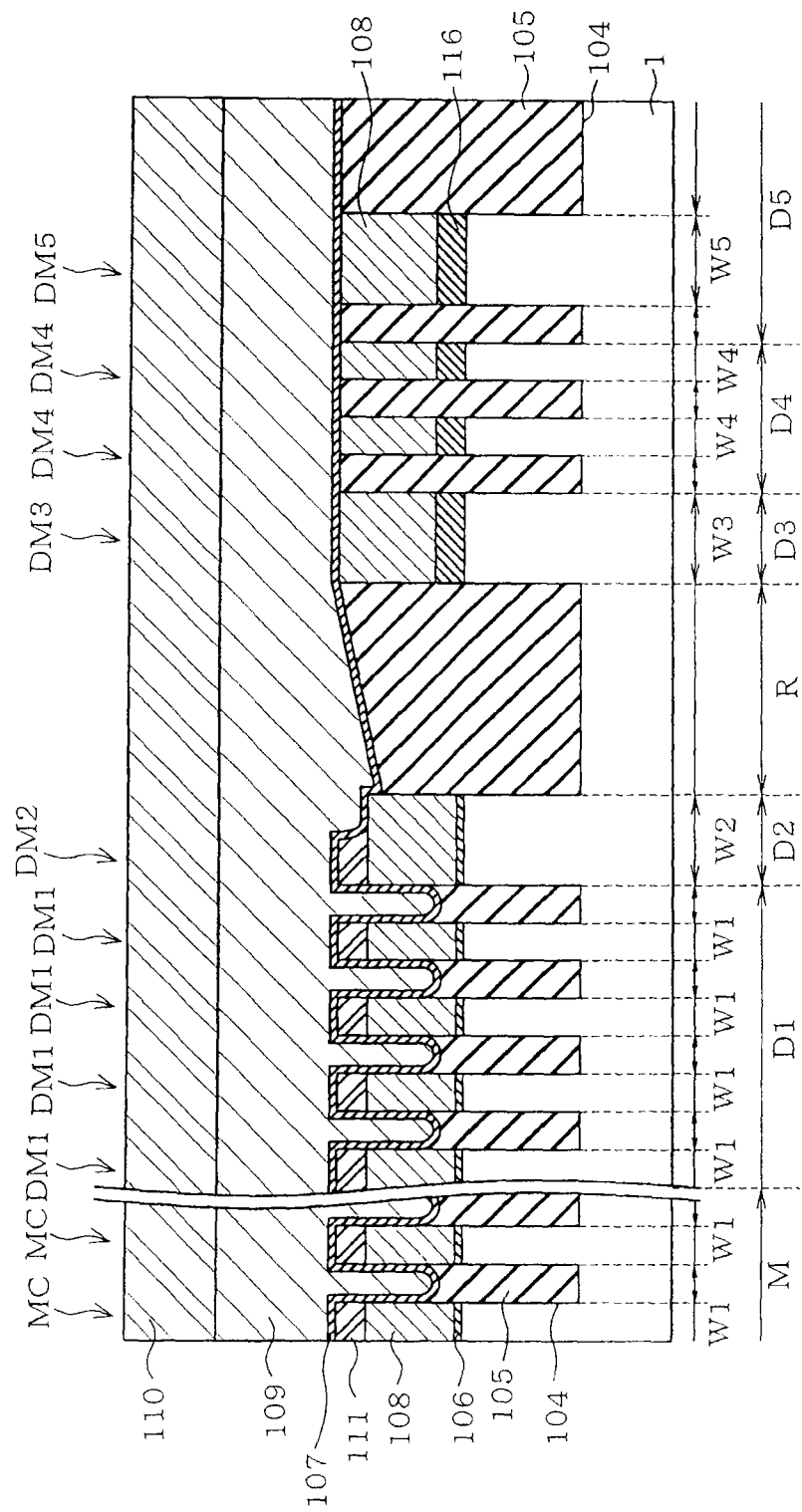
FIG. 24 is one schematic example of a vertical cross-sectional view taken along line XXIV-XXIV of FIG. 23 of the third embodiment.

FIG. 23 is one schematic example of a plan view illustrating memory cell region M and dummy cell region D in part. FIG. 24 is one schematic example of a cross sectional view taken along the X direction (word line direction) and illustrates a vertical cross sectional structure centering on dummy cell region D. Peripheral circuit region P is provided on the right side of FIG. 24 and memory cell region M is provided on the left side of FIG. 24.

As shown in FIG. 23, memory cell region M includes memory cells MC each having a first width W1. Element isolation region 2 is formed between memory cells MC disposed in the X direction. Element isolation region 2 has width S1.

Dummy cell region D includes first dummy cell region D1 and second dummy cell region D2. First dummy cell region D1 includes dummy cells DM1 having first width W1. Second dummy cell region D2 includes dummy cells DM2 having second width W2 greater than first width W2.

Element isolation region 2 is formed between dummy cells DM1 disposed in the X direction. Element isolation region 2 has width S1 in dummy region D as well. Memory cell MC and dummy cell DM1 may be formed in the substantially same size.

Dummy cell region D further includes third dummy cell region D3 disposed adjacent to second dummy cell region D2 with region R for forming element isolation film 5 located therebetween. Region R for forming element isolation film 5 (element isolation region 2) is greater than width S1. Third dummy cell region D3 includes dummy cell DM3 having third width W3 being greater than first width W1 and substantially equal to second width W2.

Dummy cell region D further includes fourth dummy cell region D4 adjacent to third dummy region D3. Dummy cell region D4 includes dummy cell DM4 having fourth width W4 less than third width W3. Dummy cell region D further includes fifth dummy cell region D5 adjacent to fourth dummy cell region D4. Dummy cell region D5 includes dummy cell DM5 having fifth width W5 greater than fourth width W4.

As shown in FIG. 24, memory cell MC of memory cell region M comprises a stack of polysilicon film 108 serving as a charge storing layer, cap film 111, interelectrode insulating film 107, polysilicon film 109, and low resistance metal film 110 disposed above a relatively thin gate insulating film 106. Cap film 111 is formed above polysilicon film 108. Carbon (C) or nitrogen (N) may or may not be introduced into polysilicon film 108.

Except for the above differences, gate structure of memory cell MC of the third embodiment is substantially the same as those described in the foregoing embodiments. Cap film 111 is provided above polysilicon film 108 in order to relax the concentration of electric field caused by high electric field applied by word line WL.

Dummy cell DM1 in first dummy region D1 comprises a stack of polysilicon film 108 serving as a dummy charge storing layer, cap film 111, interelectrode insulating film 107, polysilicon film 109, and low resistance metal film 110 disposed above a relatively thin gate insulating film 106. Cap film 111 is formed above polysilicon film 108. Carbon (C) or nitrogen (N) may or may not be introduced into polysilicon film 108. First dummy cell DM1 may be substantially identical in structure as memory cell MC.

Dummy cell DM2 of second dummy cell region D2 has a stacked structure above semiconductor substrate 1 which is substantially identical to the stacked structure of first dummy cell region D1 except for the lateral widths of gate insulating film 106 and polysilicon film 108 being formed in a second width W2. Cap film 111 is formed above a portion of polysilicon film 108 located in dummy cell region D1 side and not entirely above the upper surface of polysilicon film 108. Gate insulating film 106 of dummy cells DM1 and DM2 has a first thickness.

The upper surface of element isolation film 105 in region R becomes higher toward region D3 from region D2. The upper surface of element isolation film 105 located near the boundary of region R and region D2 is lower than the upper surface of polysilicon 108 of dummy cell DM2. The upper surface of element isolation film 105 located near the boundary of region R and region D3 is substantially coplanar with the upper surface of polysilicon film 108 of dummy cell DM3.

Dummy cell DM3 of third dummy region D3 comprises a stack of polysilicon film 108 serving as a dummy charge storing layer, interelectrode insulating film 107, polysilicon film 109, and low resistance metal film 110 disposed above gate insulating film 116. Gate insulating film 116 has as second thickness greater than the first thickness. The sidewalls of polysilicon film 108 of dummy cell DM3 is completely covered by element isolation film 105.

Dummy cell DM4 of fourth dummy cell region D4 has a stacked structure above semiconductor substrate 1 which is substantially identical to the stacked structure of dummy cell DM3 of third dummy cell region D3 except for the X direction widths of gate insulating film 116 and polysilicon film 108 being formed in a fourth width W4. The sidewalls of polysilicon film 108 of dummy cell DM4 are also completely covered by element isolation film 105.

Dummy cell DM5 in fifth dummy cell region D5 has a stacked structure above semiconductor substrate 1 which is substantially identical to the stacked structure of dummy cell DM4 in fourth dummy cell region D4 except for the X direction widths of gate insulating film 116 and polysilicon film 108 being formed in fifth width W5 greater than fourth width W4. The sidewalls of polysilicon film 108 of dummy cell DM5 are also completely covered by element isolation film 105.

In the cross section illustrated in FIG. 24, interelectrode insulating film 107 is formed continuously across region M, regions D1 and D2, and regions D3 to D5. In first dummy cell D1, interelectrode insulating film 107 is formed continuously along the upper surface and sidewalls of cap film 111 of dummy cell DM1, the sidewalls of polysilicon film 108, and the upper surface of element isolation film 105.

In second dummy cell region D2, interelectrode insulating film 107 is formed along the upper surface and sidewalls of cap film 111 of dummy cell DM2, the sidewalls of polysilicon film 108, and the exposed upper surface of polysilicon film 108 located in region R side. Interelectrode insulating film 107 is formed along the wide upper surface of element isolation film 105 located in region R between second and third dummy cell regions D2 and D3.

In region R, the upper surface of element isolation film 105 is gradually sloped. The slope starts from a location slightly below the upper surface of polysilicon film 108 of dummy cell DM2 and ends at the upper surface of polysilicon film 108 of dummy cell DM3. The height of the slope is equal to the difference in the thickness of the thin gate insulating film 106 and the thick gate insulating film 116.

Interelectrode insulating film 107 is further formed along the upper surfaces of polysilicon films 108 of third, fourth, and fifth dummy cell regions D3, D4, and D5 and along the upper surfaces of interposed element isolation films 105. In third, fourth, and fifth dummy cell regions D3, D4, and D5, the upper surfaces of polysilicon films 108 and the upper surfaces of element isolation film 105 are substantially coplanar. As a result, the height of interelectrode insulating film 107 is substantially level across regions D3, D4, and D5. In the cross section illustrated in FIG. 24, polysilicon film 109 and low resistance metal film 110 are stacked above the upper surface of interelectrode insulating film 107.

In the third embodiment, cap film 111 is formed between polysilicon film 108 and interelectrode insulating film 107 in first and second dummy cell regions D1 and D2. As a result, it is possible to relax the concentration of electric field even when high electric field is applied to polysilicon film 109 and low resistance metal film 110. Because a part of cap film 111 of dummy cell DM2 is removed, it is possible to increase the coupling ratio of in dummy cell DM2 and improve voltage tolerance properties.

(Manufacturing Method)

One example of a manufacturing process flow for obtaining the structure illustrated in FIG. 24 will be described with reference to FIGS. 25 to 34. Because memory cell MC is similar in structure to dummy cell DM1, the manufacturing process flow of memory cell MC will not be shown.

Figure 25:
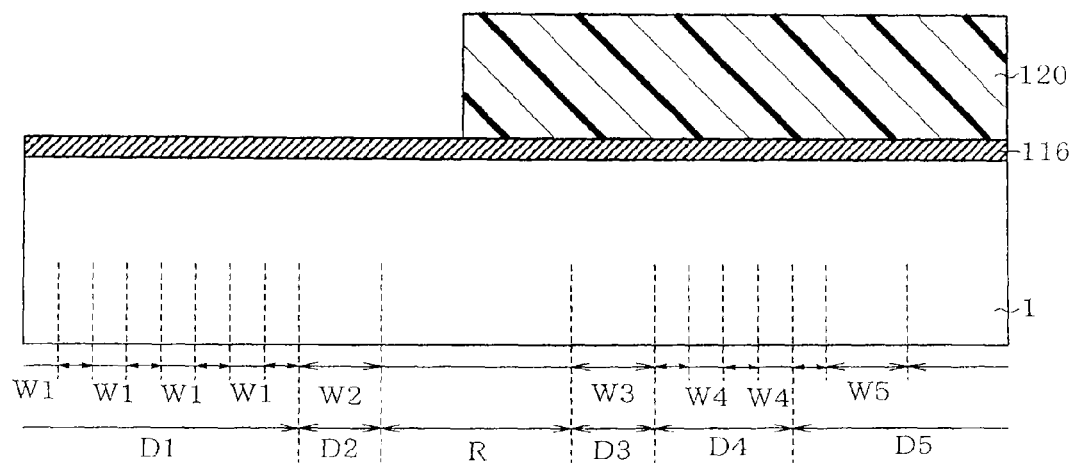
FIGS. 25 to 34 are examples of vertical cross sectional views each schematically illustrating one phase of the manufacturing process flow of a portion corresponding to FIG. 24 of the third embodiment.

As shown in FIG. 25, silicon substrate serving as semiconductor substrate 1 is thermally oxidized, for example, to form gate insulating film 116 comprising a silicon oxide film. Gate insulating film 116 is used to provide high voltage tolerance in dummy cells DM3, DM4, and DM5 in dummy cell region D and used in high level voltage transistors in peripheral circuit region P. Then, resist pattern 120 is formed above gate insulating film 116 located in third, fourth, and fifth dummy cell regions D3, D4, and D5 and in a portion of region R of dummy cell region R and above gate insulating film 116 located in the region for forming high level voltage transistors in peripheral circuit region P.

Figure 26:
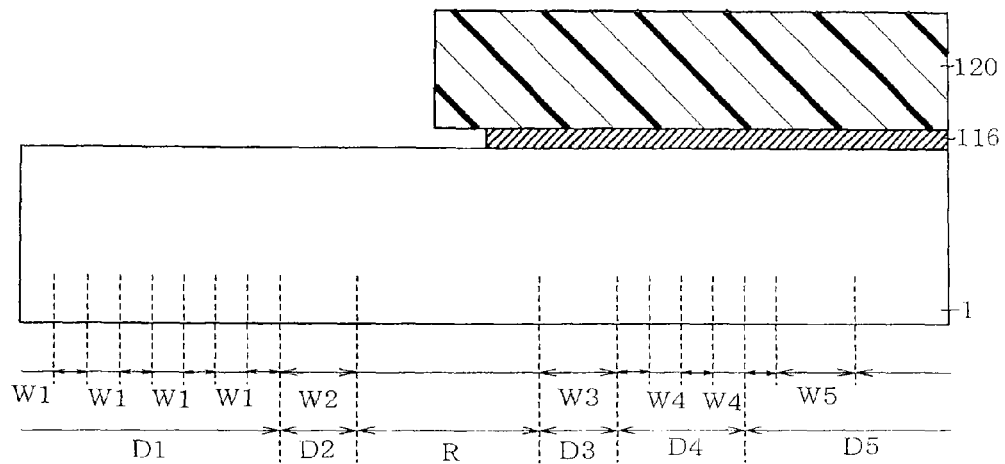

As shown in FIG. 26, gate insulating film 116 formed in first and second dummy cell regions D1 and D2 and memory cell region M is removed by wet etching using resist pattern 120 as a mask. As a result of such etching, gate insulating film 116 in first and second dummy cell regions D1 and D2 and memory cell region M as well as a portion of gate insulating film 116 of region R is removed to expose the surface of semiconductor substrate 1 in region R.

Figure 27:
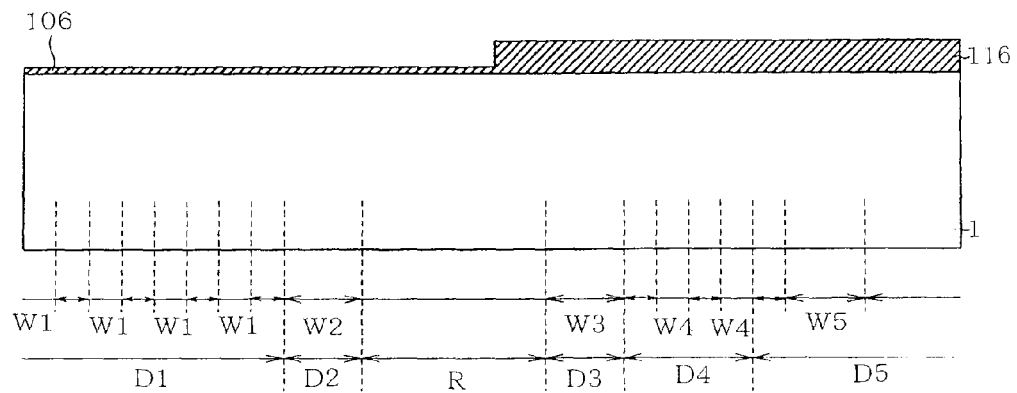

As shown in FIG. 27, resist pattern 120 is removed and the etched regions (memory cell region M, first and second dummy cell regions D1 and D2, a portion of region R) are subjected to another thermal oxidation process to form gate insulating film 106.

Gate insulating film 106 is thinner than gate insulating film 116. As a result of the above described processes, it is possible to form gate insulating films 106 and 116 across memory cell region M, first to fifth dummy cell regions D1 to D5, and peripheral circuit region P (not shown).

Figure 28:
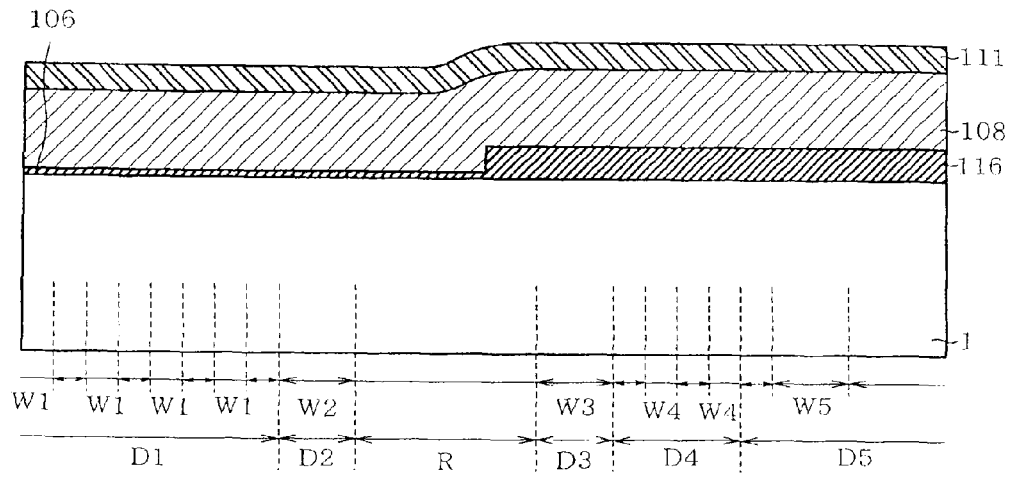
Figure 29:
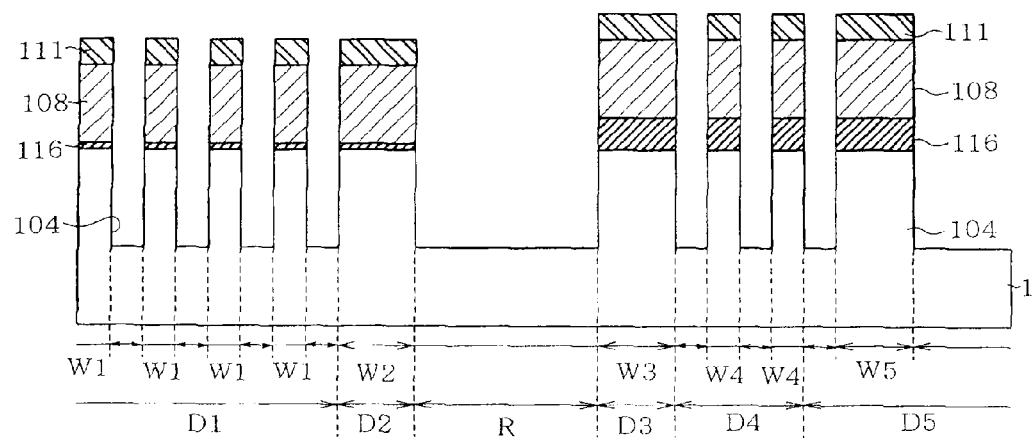

As shown in FIG. 28, polysilicon film 108 is deposited for example by CVD. Above polysilicon film 108, cap film 111 comprising a silicon nitride film (SiN) and serving as a mask is formed for example by CVD.

Impurities may be doped during the deposition as described in the first and the second embodiments.

Then, a hard mask not shown comprising a silicon oxide film or the like, is deposited above cap film 111 by methods such as CVD and a resist pattern not shown is formed above the hard mask. Using the resist pattern, the hard mask, and cap film 111 as a mask in sequence, element isolation trench 104 is formed by dry etching using RIE a shown in FIG. 29.

As a result, it is possible to form gate insulating film 6 and floating electrodes FG described in the foregoing embodiments and isolate element regions 3. Silicon film 108 which is amorphous immediately after its formation is polycrystallized by thermal treatment performed later in the process flow.

Figure 30:
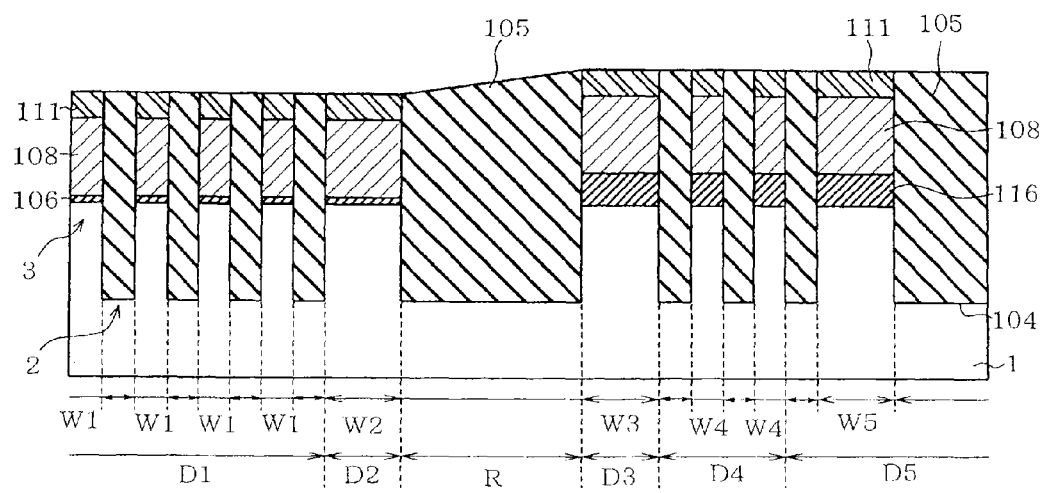

As shown in FIG. 30, element isolation trench 105 is filled into element isolation trench 104 and element isolation film 105 is planarized by CMP using the upper surface of cap film 111 as a stopper. Element isolation film 105 is formed by a material similar to those described in the foregoing embodiments for forming element isolation film 5. The upper surface of element isolation film 105 in region R becomes higher toward region D3 from region D2 because of the variation in the width of element isolation region 2.

Figure 31:
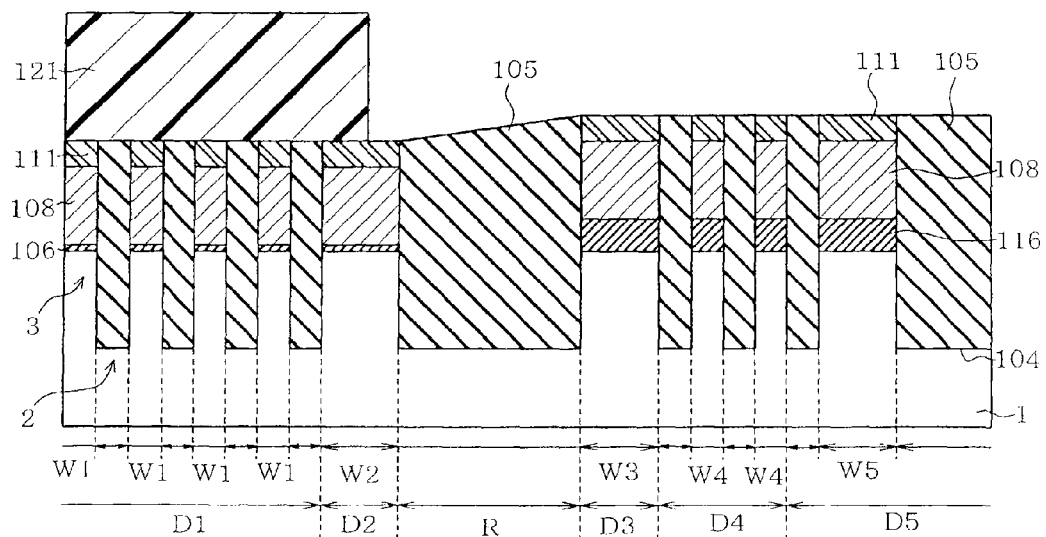

As shown in FIG. 31, among dummy cells DM1 to DM5 formed in dummy cell region D, resist pattern 121 is formed in dummy cells DM1 and DM2 in which the thickness of gate insulating film 106 is equal to the thickness of gate insulating film 106 in memory cell region M. More specifically, resist pattern 121 is formed so as to cover first dummy cell region D1 and a part of the wide polysilicon film 108 located in second dummy cell region D2. As can be seen in FIG. 31, the boundary of resist pattern 121 is located above about the central portion of the wide element region 3 (the wide polysilicon film 108).

Figure 32:
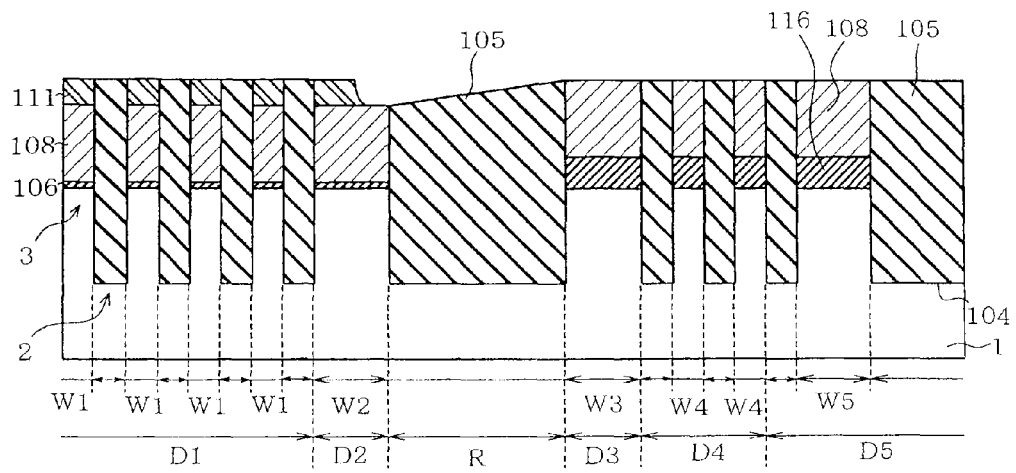

As shown in FIG. 32, isotropic etching is performed using resist pattern 121 as a mask to remove a portion of the wide cap film 111 located in second cell region D1. Cap films 111 in region R and regions D3 to D5 are removed.

Figure 33:
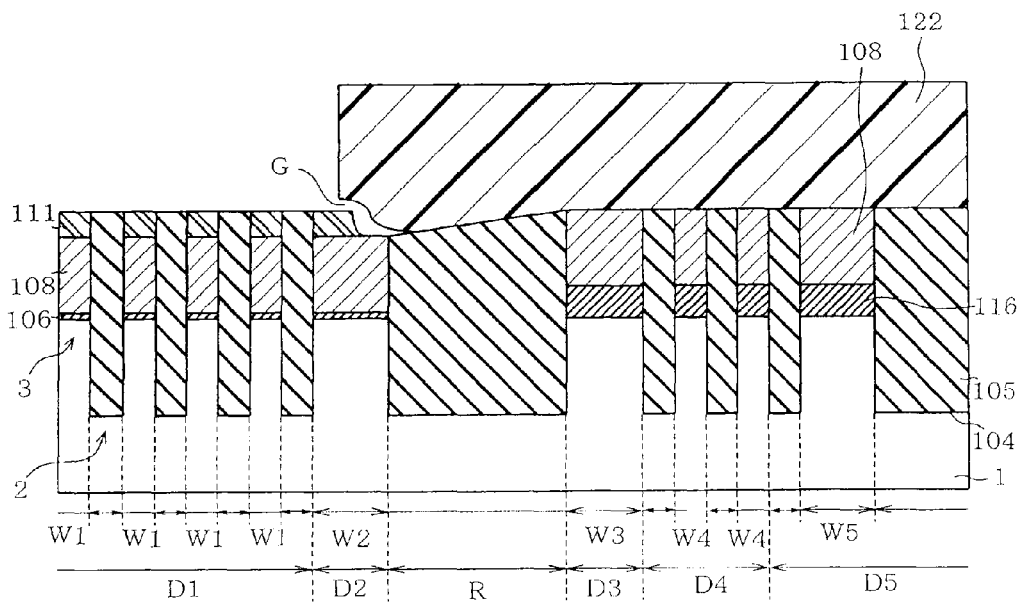

After removing resist pattern 121, resist pattern 122 is formed in second to fifth dummy cell regions D2 to D5 as shown in FIG. 33 so as to cover the region where cap film 111 is removed in second dummy cell region D2 and cover a portion of cap film 111 located above the wide polysilicon film 108 in second dummy cell region D2.

Figure 34:
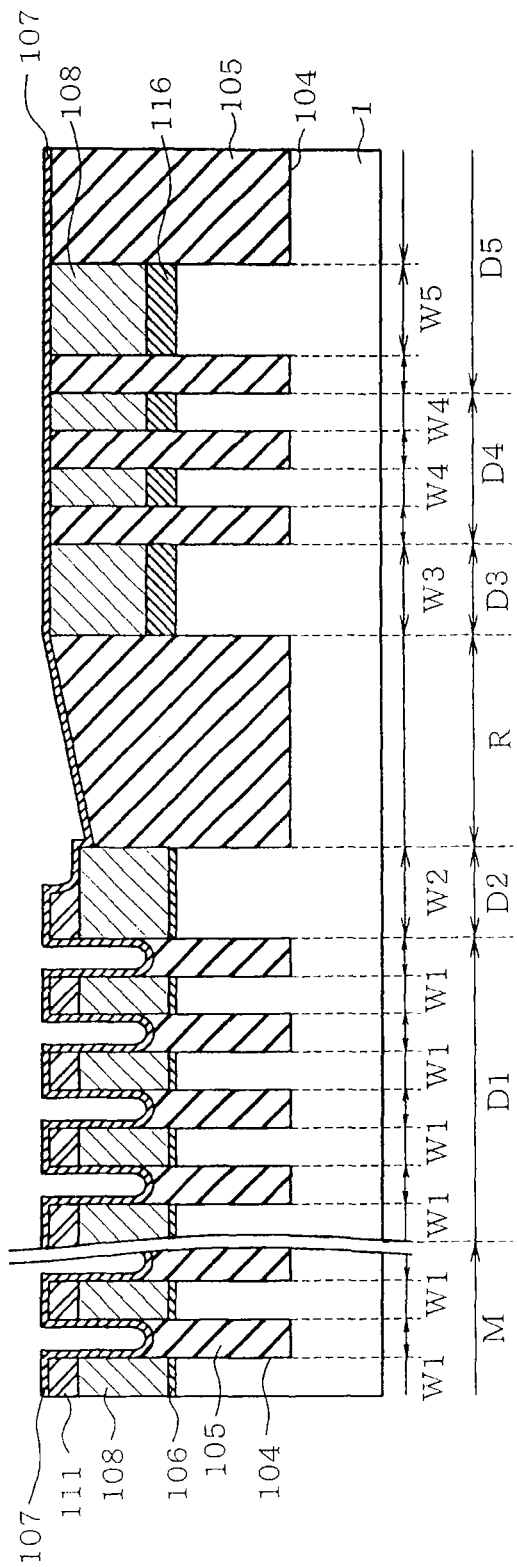

Using resist pattern 122 as a mask, upper portion of element isolation film 105 is removed by selective etching (wet etching) to expose the upper sidewalls of polysilicon film 108 as shown in FIG. 34. Element isolation film 105 in first dummy cell region D1 is etched back so that the upper surface of element isolation film 105 is lower than the upper surface polysilicon film 108 and higher than the upper surface of gate insulating film 106. The upper portion of element isolation film 105 in first dummy cell region D1 (as well as the upper portion of element isolation film 105 in memory cell region M) is shaped like a "U" as shown in FIG. 34.

Cap film 111 and resist pattern 122 are formed in second to fifth dummy cell regions D2 to D5. Thus, in principle, element isolation film 105 is not etched back in the foregoing regions. However, the chemical liquid used in the wet etching may permeate into element isolation film 105 in region R from gap G formed between polysilicon film 108 and resist pattern 122 as shown in FIG. 33. As a result, element isolation film 105 of region R may become lower as the distance from second dummy cell region D2 becomes closer. Resist pattern 122 is removed after the wet etching.

As shown in FIG. 34, interelectrode insulating film 107 is formed above the patterned stacked structures by methods such as CVD. Interelectrode insulating film 107 above element isolation film 105 in first dummy cell region D1 (as well as in memory cell region M) is shaped like a "U". As shown in FIG. 24, polysilicon film 109 and low resistance metal film 110 are stacked by CVD. The subsequent process steps will not be described.

In the third embodiment, the boundary (edge) of resist pattern 121 is located above the wide polysilicon film 108 located in second dummy region D2. Thus, it is possible to remove a portion of cap film 111 above the surface of the wide polysilicon film 108 in second dummy cell region D2. As a result, it is possible to improve coupling ratio in second dummy cell region D2.

Fourth Embodiment

FIGS. 35 to 39 illustrate a fourth embodiment. The fourth embodiment differs from the third embodiment in the manufacturing process flow for forming dummy cell region D and its peripheral structures. In particular, the fourth embodiment differs from the third embodiment in the location of the boundary of resist pattern 121 and therefore the location of the boundary of remaining cap film 111.

Figure 35:
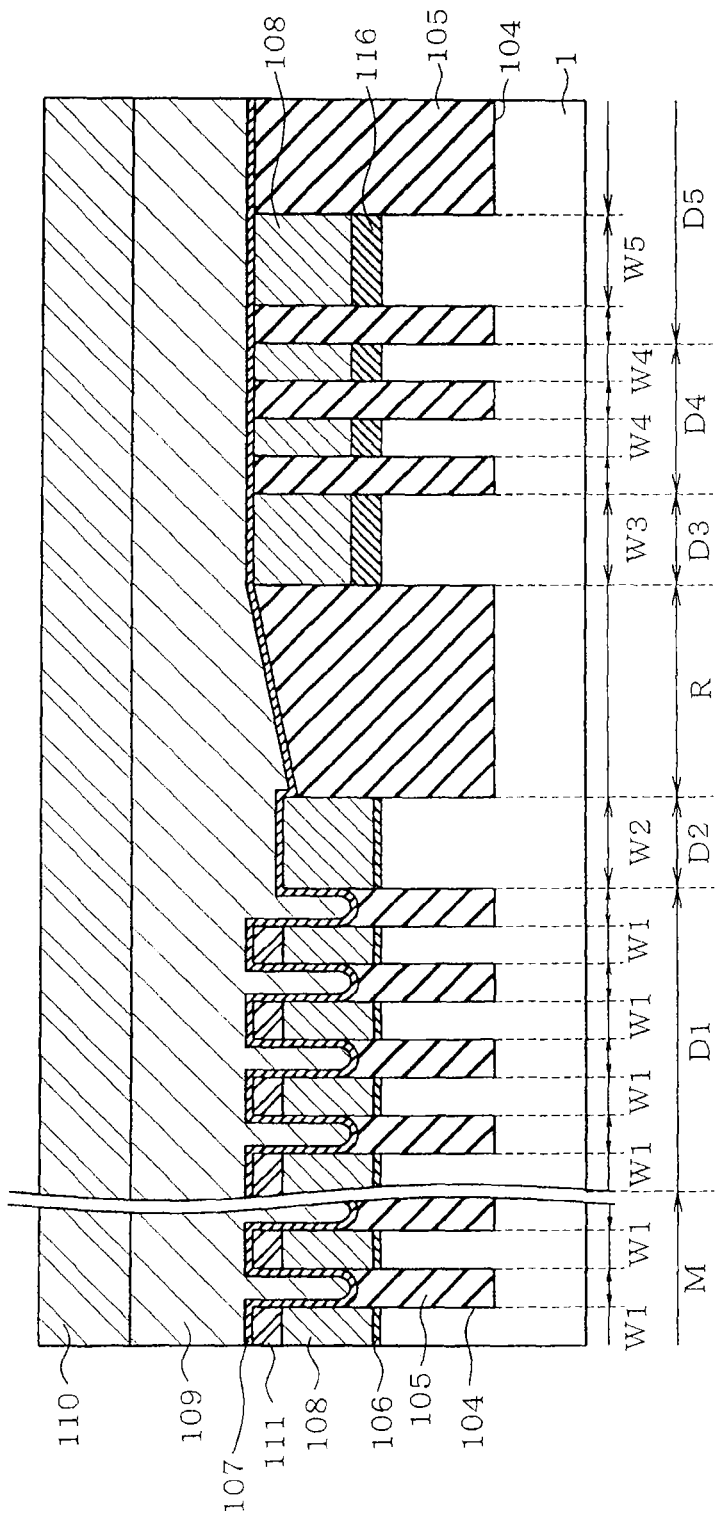
FIG. 35 illustrates a fourth embodiment and is one schematic example of a vertical cross-sectional view taken along line XXIV-XXIV of FIG. 23.

The cross section illustrated in FIG. 35 differs from the cross sectional structure of the third embodiment in that cap film 111 above polysilicon film 108 in second dummy cell region D2 is completely removed. It is possible to improve the coupling ratio in dummy cell region D2 as was the case in the foregoing embodiments even when the above described structure is adopted.

Figure 36:
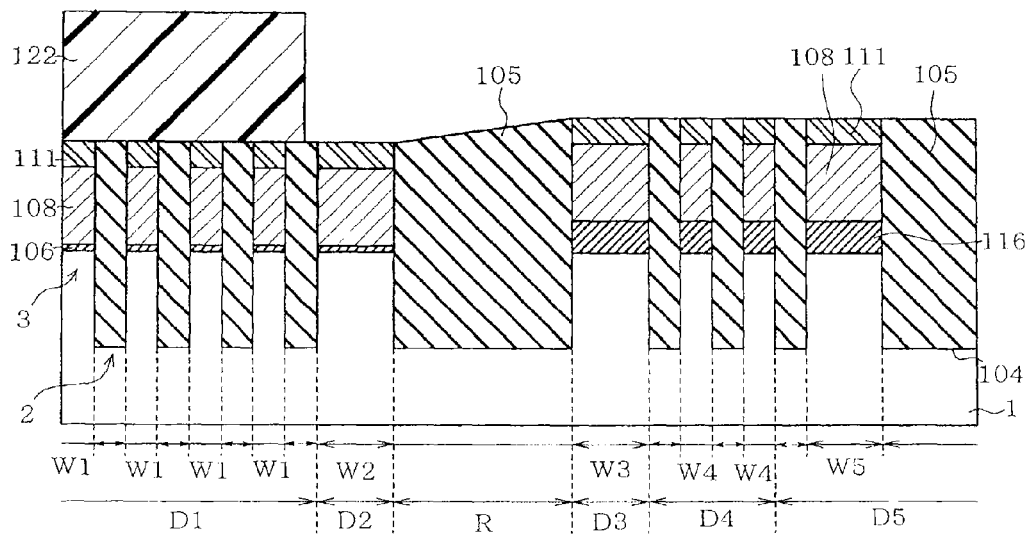
FIGS. 36 to 39 are examples of vertical cross sectional views each schematically illustrating one phase of the manufacturing process flow of a portion corresponding to FIG. 35 of the fourth embodiment.

A description is given hereinafter on the manufacturing process flow for obtaining the structure of the fourth embodiment. The process flow for obtaining the structures illustrated in FIGS. 26 to 30 will not be described because they are similar to the process flow of the third embodiment. As shown in FIG. 36, resist pattern 122 is formed after filling element isolation trenches 4 with element isolation film 105. Resist pattern 122 has a boundary located near about the central portion of element isolation film 5 located in a boundary portion between polysilicon film 108 of first dummy cell region D1 and polysilicon film 108 of second dummy cell region D2.

Figure 37:
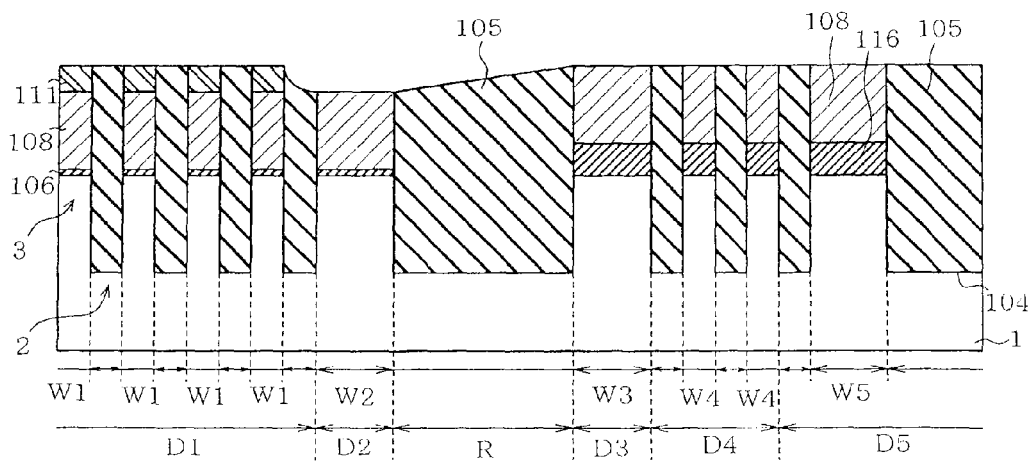

As shown in FIG. 37, cap film 111 above the wide polysilicon film 108 is almost completely removed by isotropically etching cap film 111. The upper surface of element isolation film 105 between dummy cell DM1 and dummy cell DM2 may become curved by the permeation of etching liquid.

Figure 38:
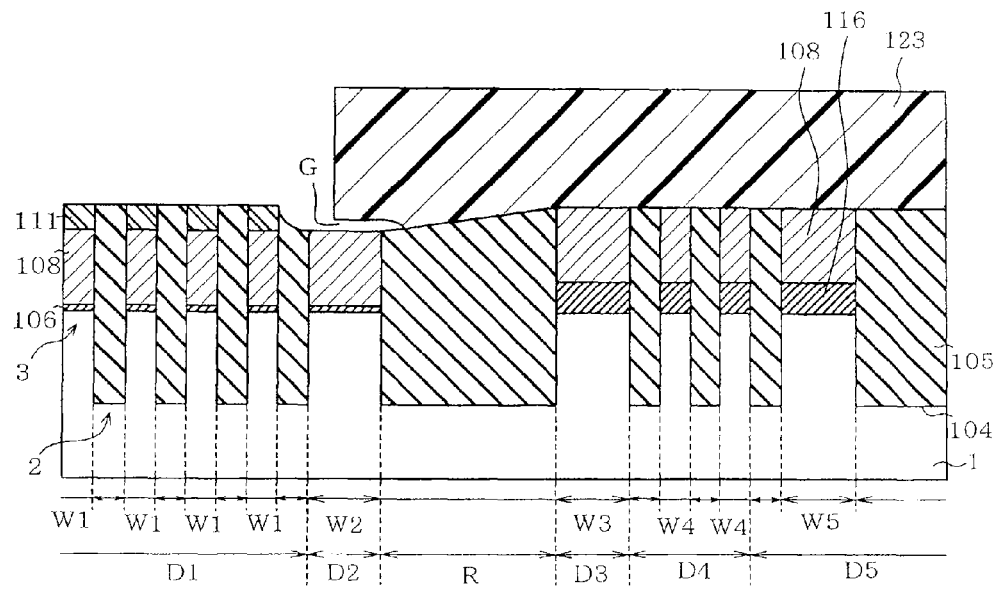

After removing resist pattern 122, resist pattern 123 is formed in a portion of second dummy cell region D2, in third to fifth dummy cell region D3 to D5, and in peripheral circuit region P as shown in FIG. 38. Resist pattern 123 covers a portion of the region where cap film 111 is removed in second dummy cell region D2 and has a boundary located near the central region of the upper surface of polysilicon film 108 in second dummy cell region D2.

Figure 39:
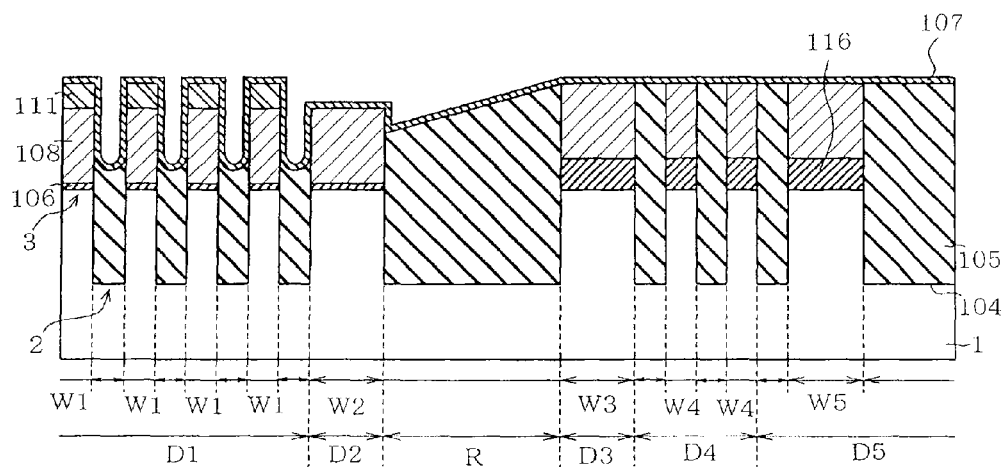
Figure 40:
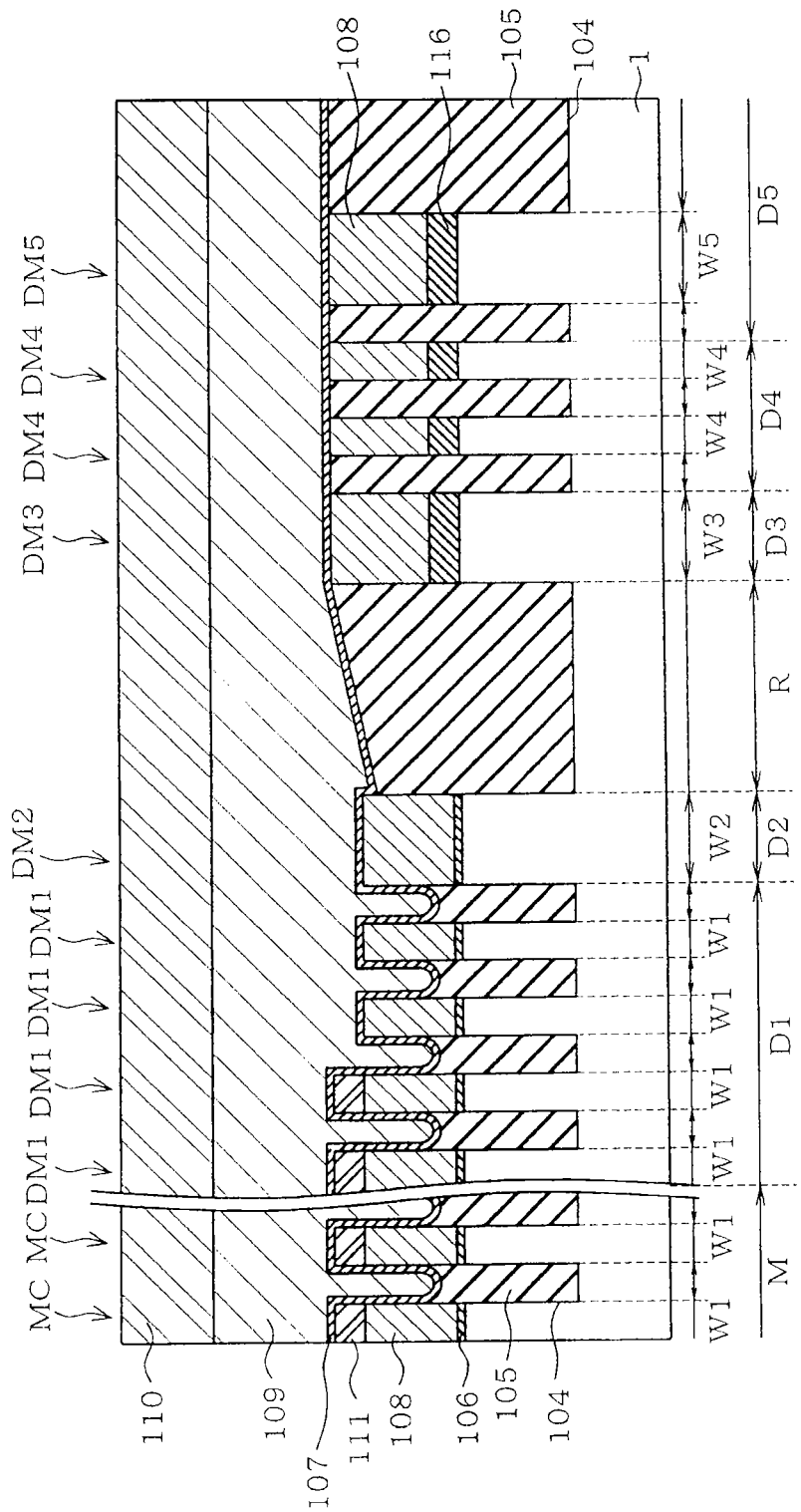
FIG. 40 illustrates a fifth embodiment and is one schematic example of a vertical cross-sectional view taken along line XXIV-XXIV of FIG. 23.

Using resist pattern 123 as a mask, the upper surface of element isolation film 105 is etched back by wet etching to expose the upper sidewalls of polysilicon film 108 as shown in FIG. 39. The chemical liquid used in the wet etching may permeate through gap G shown in FIG. 38 of resist pattern 123 and causes the upper edge of element isolation film 5 in region R to recede as was the case in the third embodiment. As a result, the upper sidewalls of polysilicon film 108 in dummy cell region D2 may be exposed. The upper surface of element isolation film 105 located between dummy cell DM1 and dummy cell DM2 may be shaped like a "U" by the permeation of the etching liquid. Then, interelectrode insulating film 107 is formed above described structures. The subsequent process steps are similar to those earlier described and thus, will not be described.

In the fourth embodiment, because the boundary of resist pattern 122 is located above element isolation film 5 between polysilicon films 108 of dummy cells DM1 and DM2, it is possible to completely remove cap film 111 above the wide polysilicon film 108 in second dummy cell region D2. As a result, it is possible to improve the coupling ratio in dummy cell DM2 in second dummy cell region D2 and further improve voltage tolerance properties.

Fifth Embodiment

FIGS. 40 to 44 illustrate a fifth embodiment. The fifth embodiment differs from the third and the fourth embodiments in the manufacturing process flow for forming dummy cell region D and its peripheral structures. In particular, the fifth embodiment differs from the third and fourth embodiment in the location of the boundary of resist pattern 121 and therefore in the location of the boundary of remaining cap film 111.

Among dummy cells DM1 in first dummy cell region D1, cap film 111 above polysilicon film 108 is removed in one or more dummy cells DM1 located in second dummy cell region D2 side. That is, in dummy cell DM1, interelectrode insulating film 107 is in direct contact with the upper surface and the upper sidewalls of polysilicon film 108. Polysilicon film 109 and low resistance metal film 110 is stacked above interelectrode insulating film 107.

A description is given hereinafter on the manufacturing process flow for obtaining the structure of the fifth embodiment. The process flow for obtaining the structures illustrated in FIGS. 26 to 30 will not be described because they are similar to the process flow of the third embodiment.

Figure 41:
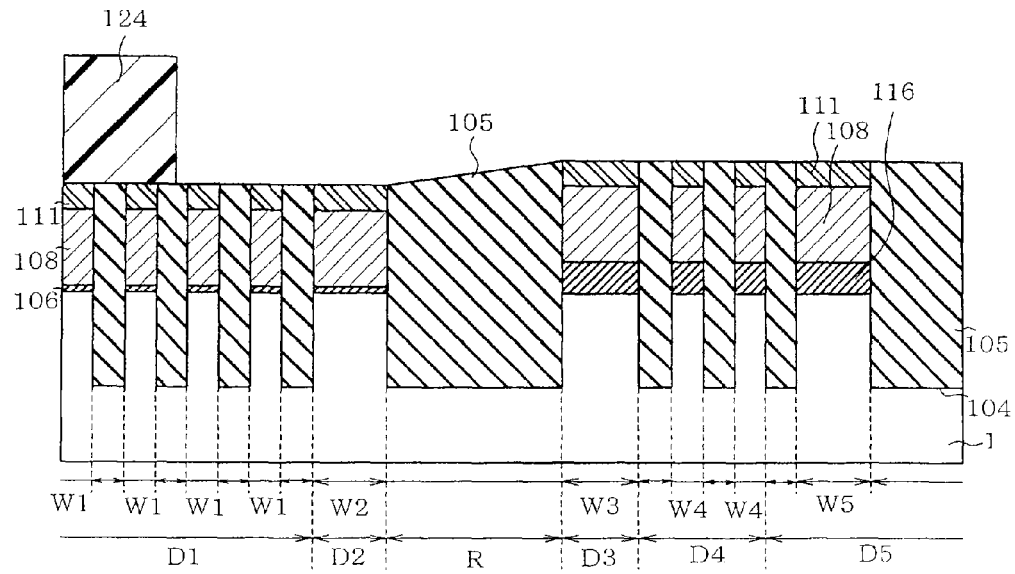
FIGS. 41 to 44 are examples of vertical cross sectional views each schematically illustrating one phase of the manufacturing process flow of a portion corresponding to FIG. 40 of the fifth embodiment.

As shown in FIG. 41, resist pattern 124 is formed after filling element isolation trenches 104 with element isolation film 105. Resist pattern 124 has a boundary located near about the central portion of the upper surface of element isolation film 5 which isolates polysilicon film 108 located in first dummy cell region D1.

Figure 42:
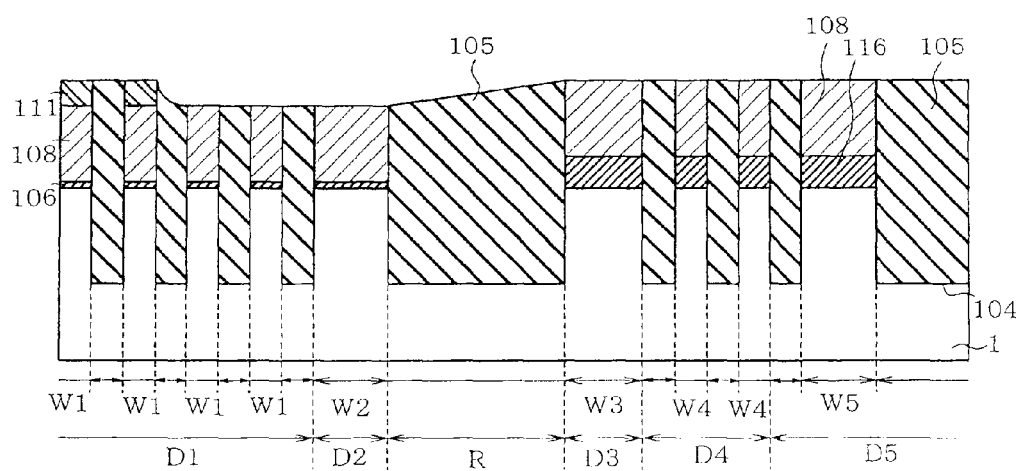

As shown in FIG. 42, a portion of cap films 111 located in dummy cell region D1 and cap films 111 located above the wide or the narrow polysilicon films 108 in dummy cell regions D2 to D5 are removed by isotropically etching cap film 111. The upper surface of element isolation film 105 near the boundary of resist pattern 124 in dummy memory cell DM1 may become curved by the permeation of etching liquid. Resist pattern 124 is thereafter removed.

Figure 43:
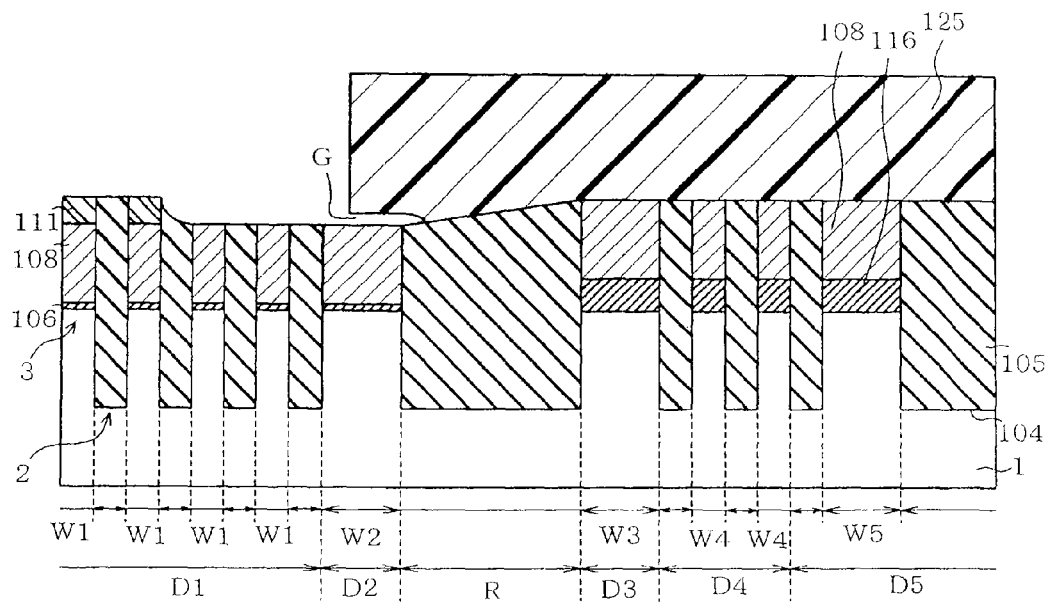

As shown in FIG. 43, resist pattern 125 is formed so as to cover dummy cell regions D3 to D5 and a portion of second dummy cell region D2 where the wide cap film 111 is removed.

Figure 44:
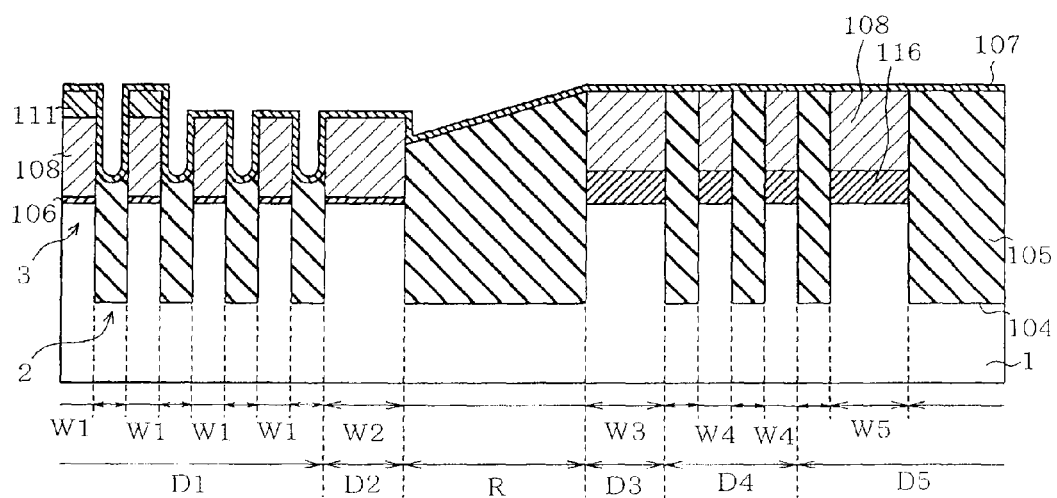

Using resist pattern 125 as a mask, the upper portion of element isolation film 105 is removed by wet etching to expose the upper sidewalls of polysilicon film 108 as shown in FIG. 44. The upper surface of element isolation film 105 located at the boundary of dummy cell DM1 with cap film 111 and dummy cell DM1 without cap film 111 may be shaped like a "U" by the permeation of the etching liquid. The chemical liquid used in the wet etching may permeate through gap G shown in FIG. 43 of resist pattern 125 and cause the upper edge of element isolation film 5 in region R to recede as was the case in the foregoing embodiments. Then, resist pattern 125 is removed, whereafter interelectrode insulating film 107 is formed. The subsequent process steps are similar to those earlier described and thus, will not be described.

In the fifth embodiment, the boundary of resist pattern 124 is located near about the central portion of the upper surface of element isolation film 5 located in first dummy cell region D1. Thus, it is possible to remove cap film 111 located above a portion of polysilicon films 108 in the first dummy cell region D1 and completely remove cap film 111 above the narrow and wide polysilicon films 108 in the second to fifth dummy cell regions D2 to D5. As a result, it is possible to increase the coupling ratio and improve the voltage tolerance properties of second dummy cell region D2 located at the edge of the memory cell array.

Sixth Embodiment

FIGS. 45 to 57 illustrate a sixth embodiment. The sixth embodiment differs from the foregoing embodiments in the manufacturing process flow for forming dummy cell region D and its peripheral structures.

Figure 45:
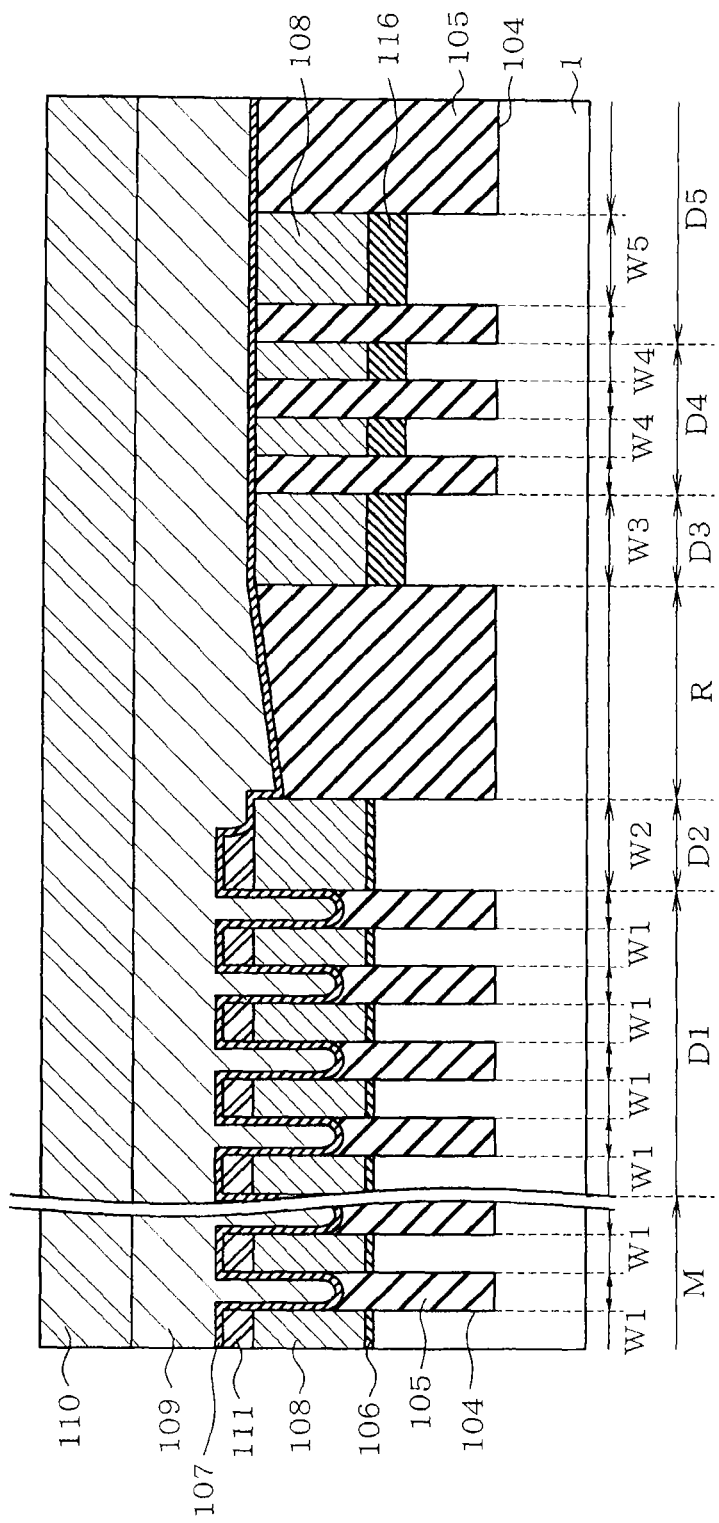
FIG. 45 illustrates a sixth embodiment and is one schematic example of a vertical cross-sectional view taken along line XXIV-XXIV of FIG. 23.

In the sixth embodiment, the heights of upper surfaces of gate insulating films 106 and 116 are equal as shown in FIG. 45. As a result, it is possible to stack each of the films 108, 107, 109, and 110 in dummy cell regions D1 to D5 without forming steps above gate insulating films 106 and 116.

Figure 46:
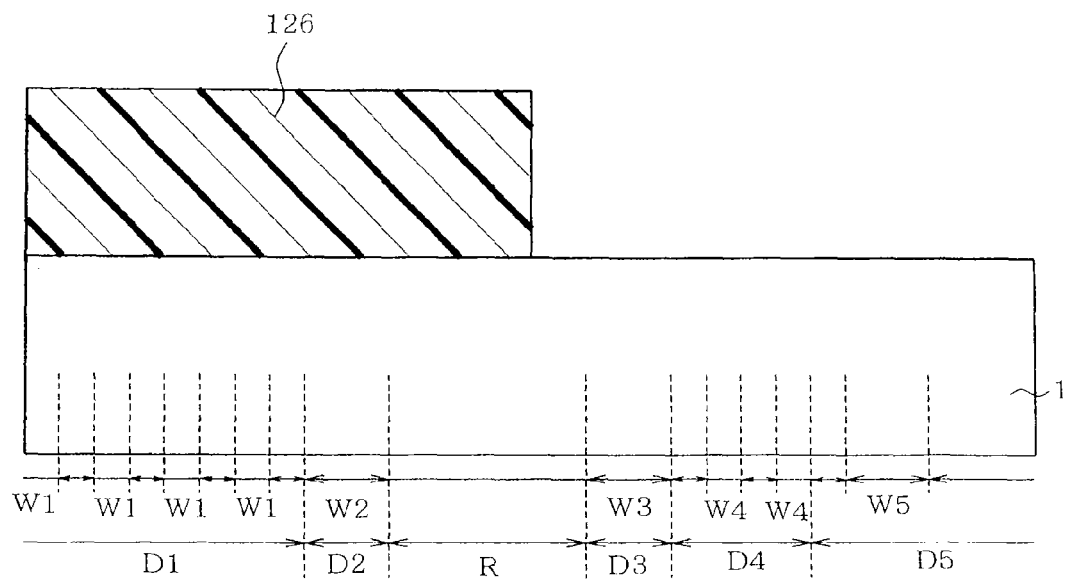
FIGS. 46 to 57 are examples of vertical cross sectional views each schematically illustrating one phase of the manufacturing process flow of a portion corresponding to FIG. 45 of the sixth embodiment.

A description will be given on the manufacturing process flow hereinafter. First, resist pattern 126 having a boundary in region R is formed above semiconductor substrate 1 as shown in FIG. 46.

Figure 47:
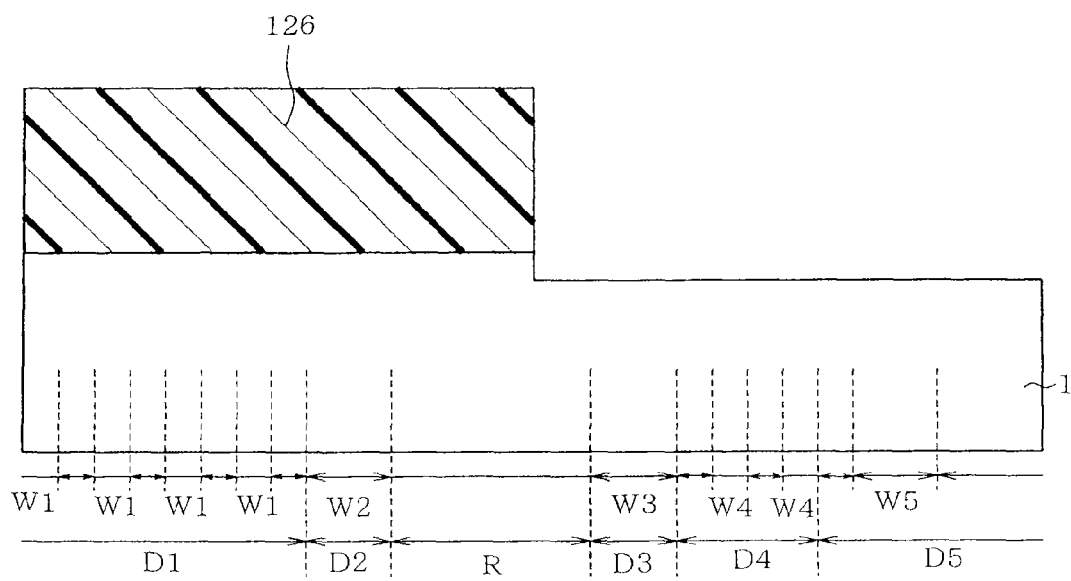

As shown in FIG. 47, the upper surface of semiconductor substrate 1 located in a first portion of region R and third to fifth dummy cell regions D3 to D5 is anisotropically etched using resist pattern 126 as a mask. As a result, the height of the upper surface of semiconductor substrate 1 located in the first portion of region R and third to fifth dummy cell regions D3 to D5 is lowered compared to other regions (first and second dummy cell regions D1 and D2, the remaining second portion of region R, and memory cell region M).

Figure 48:
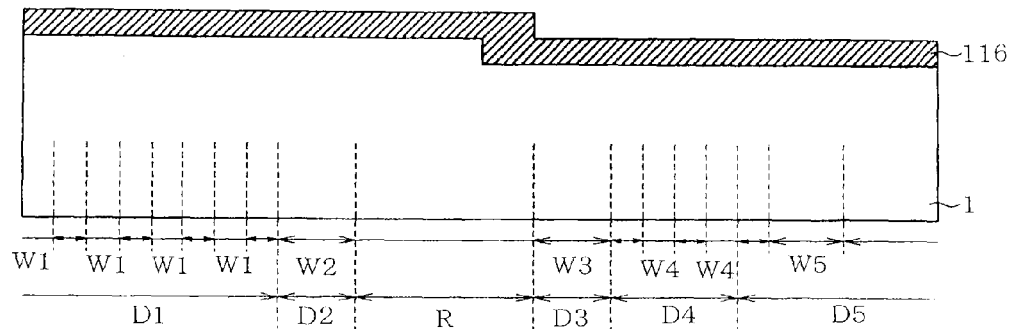
Figure 49:
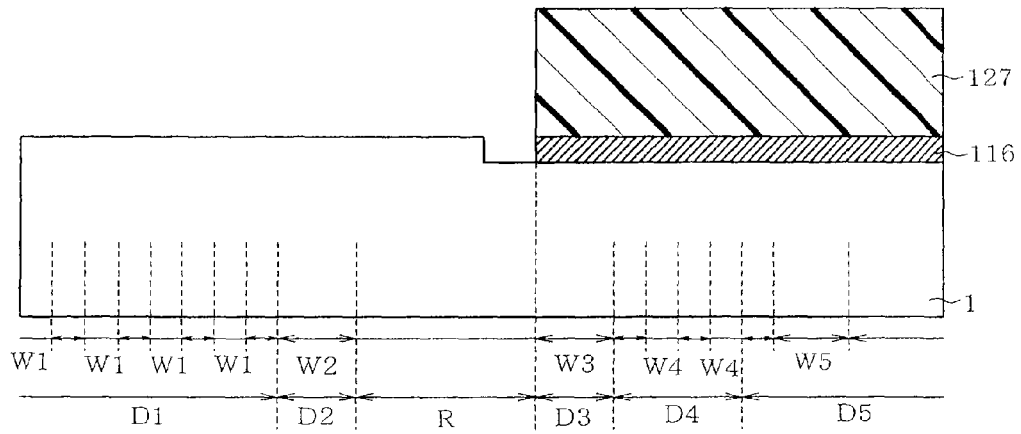

After removing resist pattern 126, gate insulating film 116 is formed in constant thickness above semiconductor substrate 1 by thermal oxidation as shown in FIG. 48. As shown in FIG. 49, resist pattern 127 is formed which has an opening exposing memory cell region M, first and second dummy cell regions D1 and D2, and region R. Using resist pattern 127 as a mask, gate insulating film 116 is removed in memory cell region M, dummy cell region D1 and D2, and region R.

In these process steps, the height of the upper surface of semiconductor substrate 1 in first and second dummy cell regions D1 and D2 and the height of the upper surface of gate insulating film 116 in memory cell region M and in third to fifth dummy cell regions D3 to D5 may be controlled to be substantially equal by controlling the duration of film formation and the duration of etch.

Figure 50:
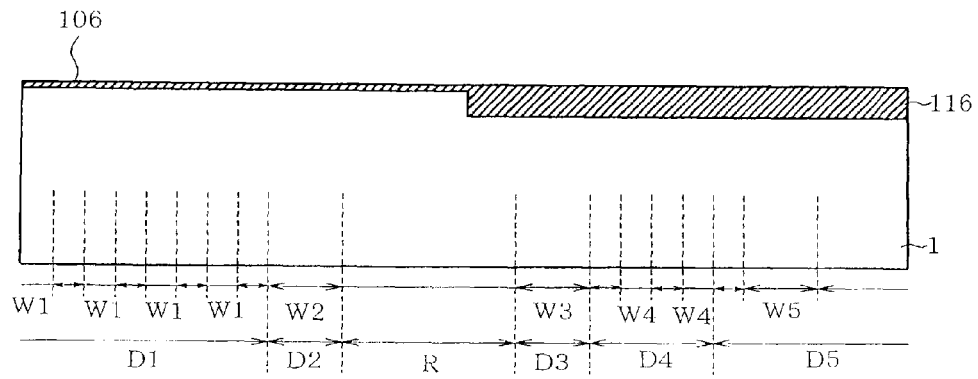

As shown in FIG. 50, thermal oxidation is performed again to form gate insulating film 106 above semiconductor substrate 1 located in memory cell region M and first and second dummy cell regions D1 and D2 and to increase the thickness of gate insulating film 116 in region R and dummy cell regions D3 to D5.

The height of the upper surface of semiconductor substrate 1 located in first and second dummy cell regions D1 and D2 and in the second portion of region R and the height of the upper surface of semiconductor substrate 1 located in third to fifth dummy cell regions D3 and D5 and in the first portion of region R are controlled to the same height in advance. As a result, it is possible to control the heights of the upper surfaces of gate insulating films 106 and 116 to be substantially equal in region R, memory cell region M, and dummy cell regions D1 to D5. The subsequent manufacturing process flow for obtaining the above described structure is similar to the manufacturing process flow of the third embodiment and thus, will only be briefly described hereinafter.

Figure 51:
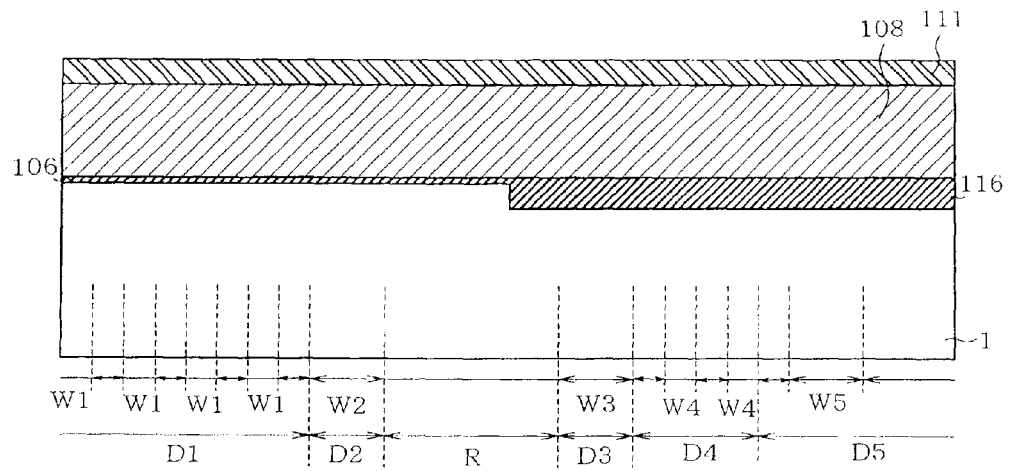

As shown in FIG. 51, polysilicon film 108 is deposited by CVD and cap film 111 comprising a silicon nitride film is formed above polysilicon film 108.

Figure 52:
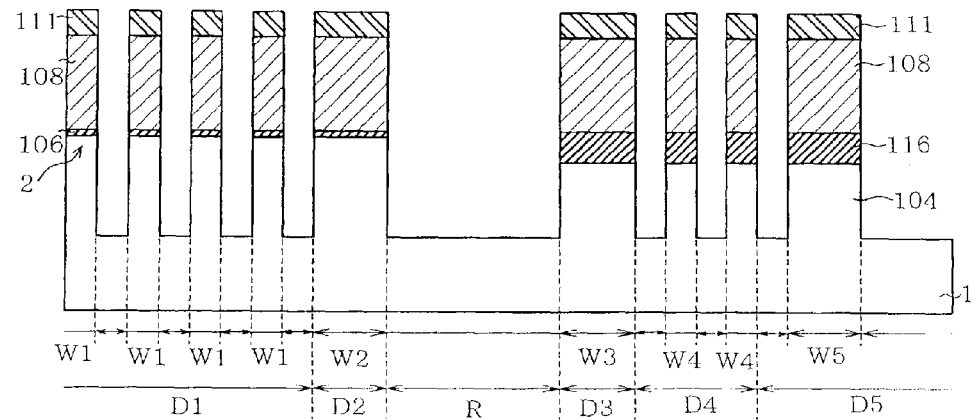
Figure 53:
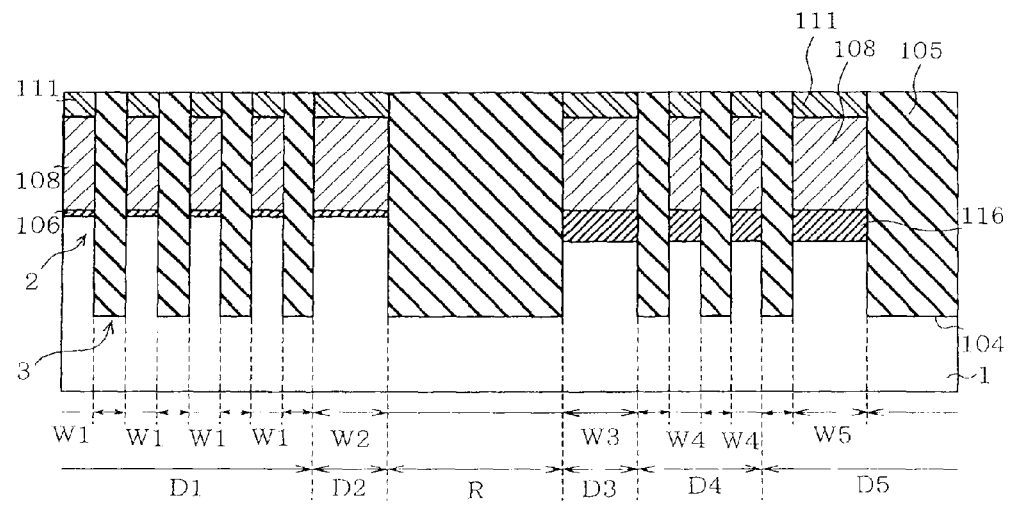

As shown in FIG. 52, element isolation trenches 104 are formed by the method described in the foregoing embodiments. As a result, it is possible to isolate gate insulating films 106 and 116, polysilicon film 108, and element isolation region 3. As shown in FIG. 53, element isolation trenches 104 are filled with element isolation film 105.

Figure 54:
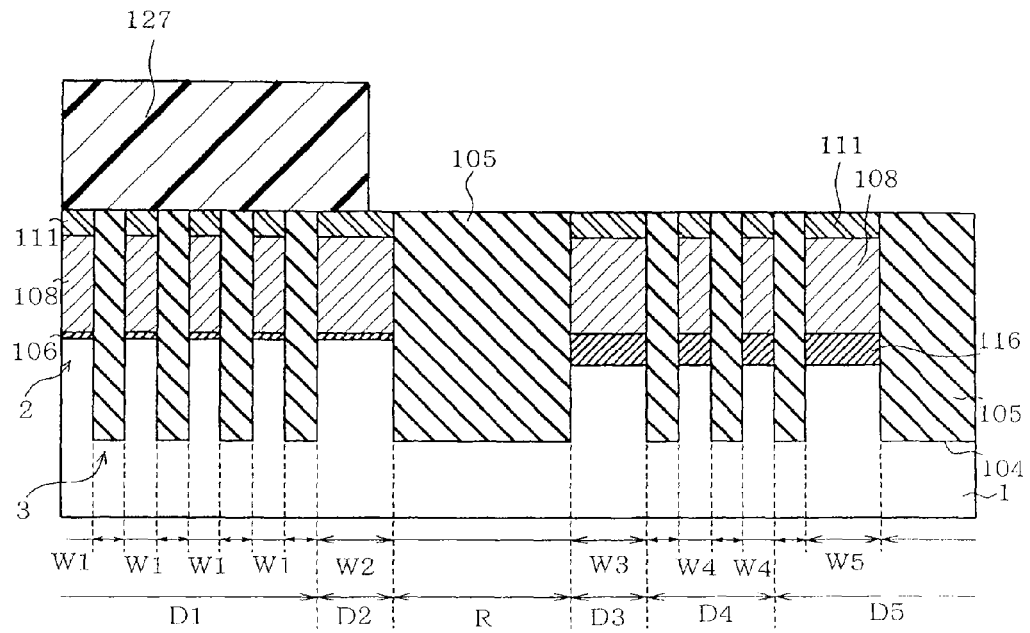
Figure 55:
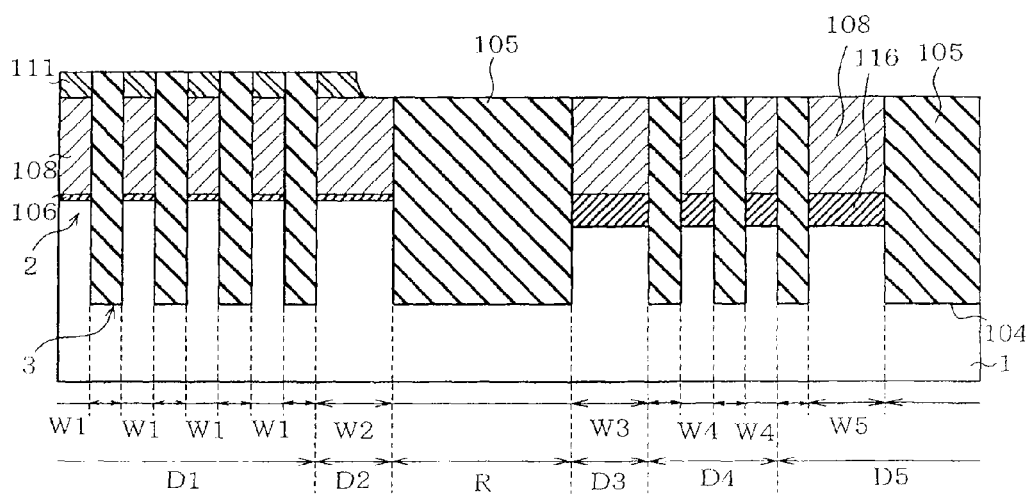
Figure 56:
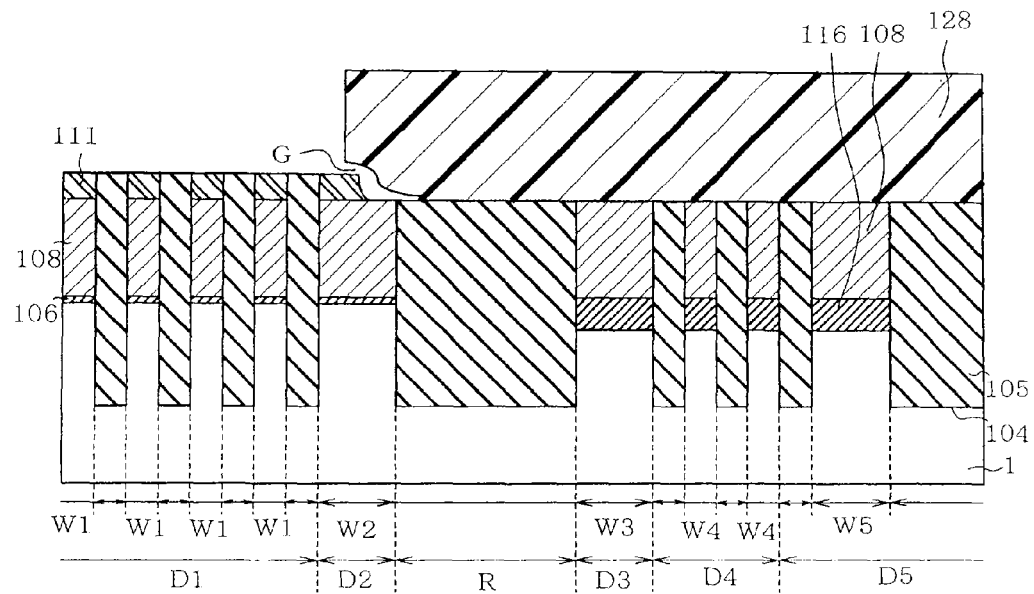

As shown in FIG. 54, resist pattern 127 is formed which has a boundary above about the central portion of polysilicon film 108 located in dummy cell region D2. As shown in FIG. 55, resist pattern 127 is removed by isotropically wet etching cap film 111. Then, as shown in FIG. 56, resist pattern 128 is formed which has a boundary above the upper surface of polysilicon film 108 located in second dummy cell region D2.

Figure 57:
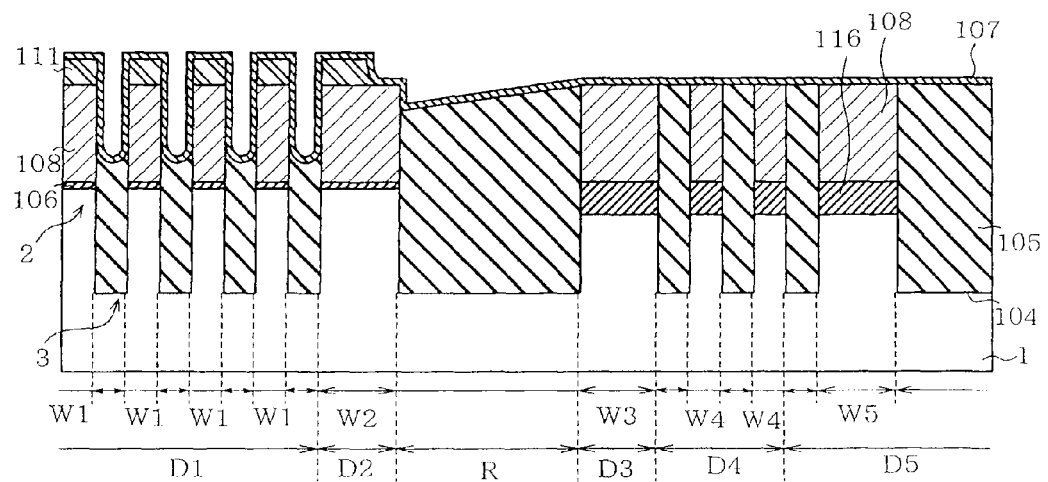

As shown in FIG. 57, the upper portion of element isolation film 105 is removed by wet etching using resist pattern 128 as a mask to expose the upper sidewalls of polysilicon film 108. Element isolation film 105 in first dummy cell region D1 is etched back so that the upper surface of element isolation film 105 is lowered below the upper surface of polysilicon film 108.

Resist pattern 128 is formed in third to fifth dummy cell regions D3 to D5. Thus, in principle, element isolation film 105 is not etched back in the foregoing regions. However, the chemical liquid used in the wet etching permeates into element isolation film 105 from gap G shown in FIG. 56 formed between polysilicon film 108 and resist pattern 128. As a result, element isolation film 105 becomes lower as the distance from second dummy cell region D2 becomes closer. Resist pattern 128 is removed after the wet etching.

The sixth embodiment also places the boundary of resist pattern 127 above the wide element region 3. As a result, it is possible to remove a portion of cap film 111 above polysilicon film 108 in second dummy cell region D2 and improve the coupling ratio of dummy cell DM2 located at the edge of the memory cell array.

In the sixth embodiment, the removing of cap film 111 in regions D1 to D2 and in regions D3 to D5 are performed using different base layers. Especially because silicon substrate 1 is anisotropically etched in advance, it is possible to form gate insulating films 106 and 116 without forming steps.

In the sixth embodiment, the process steps succeeding the advance etching of semiconductor substrate 1 follows the process steps described in the third embodiment. However, the boundary of the remaining cap film 111 may be arranged as in the fourth and the fifth embodiment.

Other Embodiments

The peripheral elements provided in peripheral circuit region P are not limited to a transistor or resistor Ra disposed in peripheral circuit PC, but may also include a capacitive element configured by gate insulating film 16 interposed between polysilicon films 18 and 38. The above described embodiments are directed to NAND flash memory device, however, other embodiments may be directed to other nonvolatile semiconductor storage devices such as NOR flash memory and EERROM.

In the first and second embodiments, polysilicon film 8 is used as a charge storing layer. The charge storing layer may, for example, comprise a single layered polysilicon film 8 or a stack of a polysilicon film and trap films such as a silicon nitride film, as long as a polysilicon film is used.

In third to sixth embodiments, polysilicon film 108 is used as a charge storing layer. The charge storing layer may, for example comprise polysilicon or polysilicon including metal particles, or a trap film such as a silicon nitride film, or a laminate of the foregoing materials.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
a memory cell region including a memory cell having a charge storing layer above a gate insulating film and a control electrode stacked above the charge storing layer via an interelectrode insulating film; and
a peripheral circuit region including a peripheral element having a first polysilicon and a first insulating film stacked above the first polysilicon;
wherein the charge storing layer includes a polysilicon doped with P-type impurity, the polysilicon doped with the P-type impurity including a first upper region contacting the interelectrode insulating film, the first upper region having a first doped layer doped with carbon (C) or nitrogen (N), and at least a portion of a region below the first doped layer is neither doped with carbon (C) nor nitrogen (N), and
wherein the first polysilicon includes a second upper region contacting the first insulating film, the second upper region having a second doped layer doped with carbon (C) or nitrogen (N), the second doped layer having a thickness equal to a thickness of the first doped layer.

2. The device according to claim 1 being applied to a NAND flash memory device.

3. The device according to claim 1, wherein the polysilicon doped with P-type impurity further includes, in a lowermost portion thereof contacting the gate insulating film, a third doped layer doped with carbon (C) or nitrogen (N).

4. The device according to claim 1, wherein the peripheral circuit region further includes a resistive element including a second polysilicon and a second insulating film stacked above the second polysilicon, and wherein the second polysilicon includes a third upper region contacting the second insulating film, the third upper region having a third doped layer doped with carbon (C) or nitrogen (N), the third doped layer having a thickness equal to the thickness of the first doped layer.

5. The device according to claim 1, wherein the thickness of the first doped layer and the thickness of the second doped layer each indicate a distance to a detection limit in which concentration of carbon (C) or nitrogen (N) can be detected, the distance being taken along a stacking direction.

6. The device according to claim 4, wherein the thickness of the first doped layer and the thickness of the third doped layer each indicate a distance to a detection limit in which concentration of carbon (C) or nitrogen (N) can be detected, the distance being taken along a stacking direction.

* * * * *